US009431793B2

(12) United States Patent
Suzuki et al.

(10) Patent No.: US 9,431,793 B2
(45) Date of Patent: Aug. 30, 2016

(54) SEMICONDUCTOR LASER DEVICE

(71) Applicant: Kabushiki Kaisha Toshiba, Minato-ku (JP)

(72) Inventors: Nobuo Suzuki, Kamakura (JP); Masaki Tohyama, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/625,103

(22) Filed: Feb. 18, 2015

(65) Prior Publication Data
US 2015/0270684 A1   Sep. 24, 2015

(30) Foreign Application Priority Data

Mar. 19, 2014   (JP) .................................. 2014-057279

(51) Int. Cl.
| | | |
|---|---|---|
| *H01S 5/12* | (2006.01) | |
| *H01S 5/10* | (2006.01) | |
| H01S 5/02 | (2006.01) | |
| H01S 5/026 | (2006.01) | |
| H01S 5/042 | (2006.01) | |
| H01S 5/065 | (2006.01) | |
| H01S 5/343 | (2006.01) | |
| H01S 5/22 | (2006.01) | |

(52) U.S. Cl.
CPC ........... *H01S 5/1231* (2013.01); *H01S 5/1032* (2013.01); *H01S 5/1237* (2013.01); *H01S 5/021* (2013.01); *H01S 5/026* (2013.01); *H01S 5/0422* (2013.01); *H01S 5/0654* (2013.01); *H01S 5/124* (2013.01); *H01S 5/2224* (2013.01); *H01S 5/34306* (2013.01); *H01S 2301/166* (2013.01)

(58) Field of Classification Search
CPC ...... H01S 5/021; H01S 5/124; H01S 5/1237; H01S 2301/16
See application file for complete search history.

(56) References Cited

U.S. PATENT DOCUMENTS

| | | | |
|---|---|---|---|
| 7,693,361 B2 | 4/2010 | Leem et al. | |
| 7,995,625 B2 | 8/2011 | Leem et al. | |

(Continued)

FOREIGN PATENT DOCUMENTS

| | | |
|---|---|---|
| JP | 2002-324948 A | 11/2002 |
| JP | 2008-204999 A | 9/2008 |
| JP | 2011-082568 A | 4/2011 |

OTHER PUBLICATIONS

Stankovic et al. ("Hybrid III-V/Si distributed feedback laser based on adhesive bonding", IEEE Phon. Tech. Ltrs., vol. 24, No. 23, Dec. 1, 2012).*

(Continued)

*Primary Examiner* — Tos T Van Roy
(74) *Attorney, Agent, or Firm* — Oblon, McClelland, Maier & Neustadt, L.L.P.

(57) ABSTRACT

A semiconductor laser device in an embodiment includes a compound semiconductor layer and a silicon layer. The compound semiconductor layer includes an active layer emitting laser light and has a first mesa structure. The silicon layer is bonded with the compound semiconductor layer. A diffraction grating is provided on a surface of the silicon layer which faces the compound semiconductor layer, and includes a main diffraction grating and two sub-diffraction gratings. The main diffraction grating extends in a longitudinal direction of the first mesa structure; the sub-diffraction gratings are disposed on both sides of the main diffraction grating.

12 Claims, 20 Drawing Sheets

(56) References Cited

U.S. PATENT DOCUMENTS

| | | |
|---|---|---|
| 8,110,823 B2 | 2/2012 | Bowers |
| 8,223,811 B2 | 7/2012 | Jones |
| 2007/0051963 A1* | 3/2007 | Chen .............................. 257/96 |
| 2007/0133648 A1* | 6/2007 | Matsuda et al. .............. 372/102 |
| 2008/0199131 A1 | 8/2008 | Matsuda |
| 2009/0116523 A1 | 5/2009 | Leem et al. |
| 2011/0299561 A1* | 12/2011 | Akiyama ................... 372/50.11 |
| 2014/0079082 A1* | 3/2014 | Feng et al. ...................... 372/20 |

OTHER PUBLICATIONS

Vivek Krishnamurthy, et al., "Optical Design of Distributed Feedback Lasers-on-Thin-Film-Silicon", IEEE Photonics Technology Letters, vol. 25, No. 10, May 15, 2013, pp. 944-947.

Qian Wang, et al., "Heterogeneous Si/III-V integration and the optical vertical interconnect access", Optics Express, vol. 20, No. 15, Jul. 16, 2012, pp. 16745-16756.

* cited by examiner

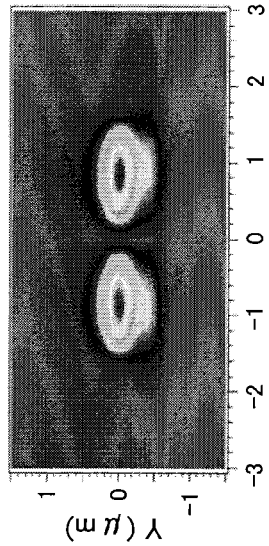
FIG.3B TE$_{10}$ MODE
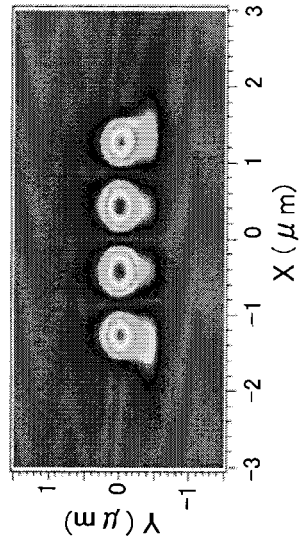
FIG.3D TE$_{30}$ MODE
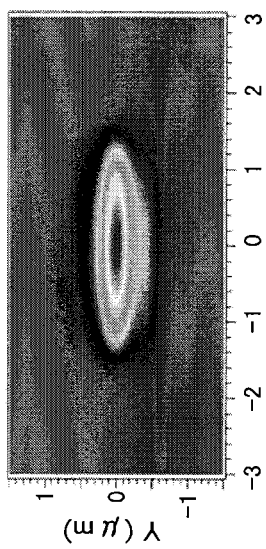
FIG.3A TE$_{00}$ MODE
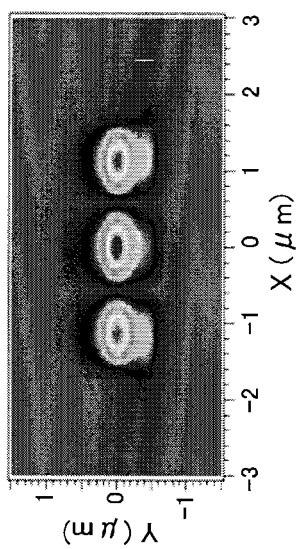
FIG.3C TE$_{20}$ MODE
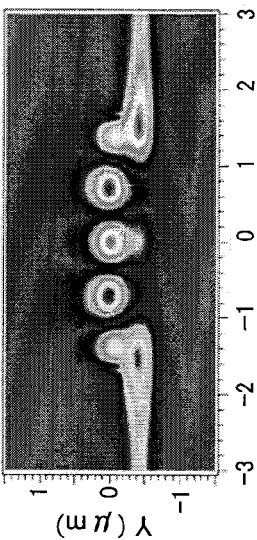
FIG.3E TE$_{40}$ MODE

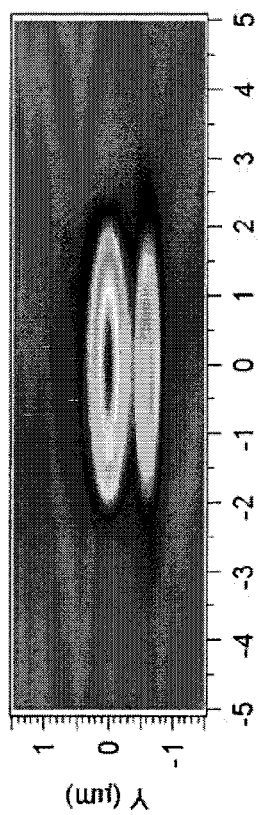
FIG.10A ZERO-ORDER ($TE_{00}$) MODE
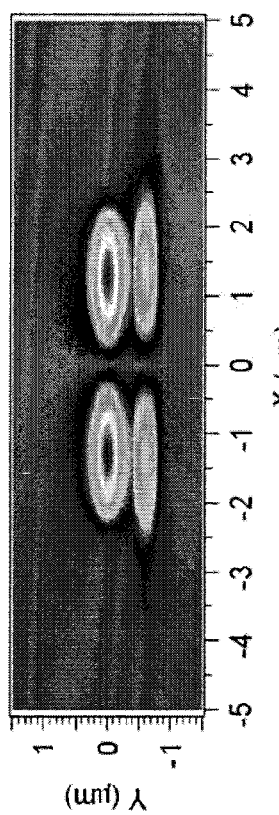
FIG.10B FIRST-ORDER ($TE_{10}$) MODE
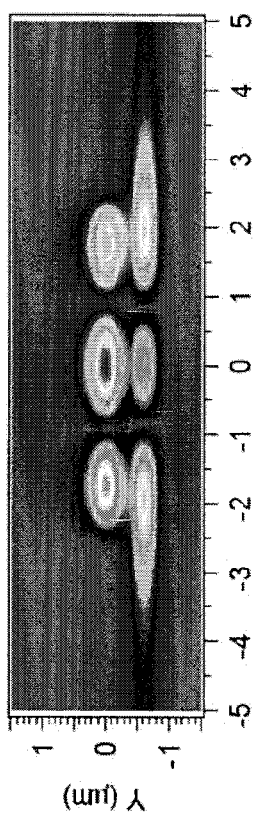
FIG.10C SECOND-ORDER ($TE_{20}$) MODE

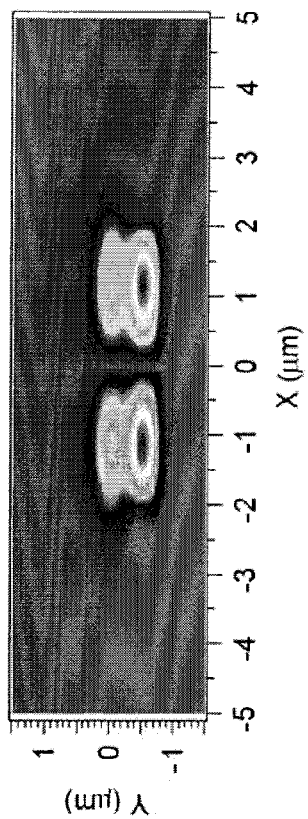
FIG.13B TE$_{10}$MODE
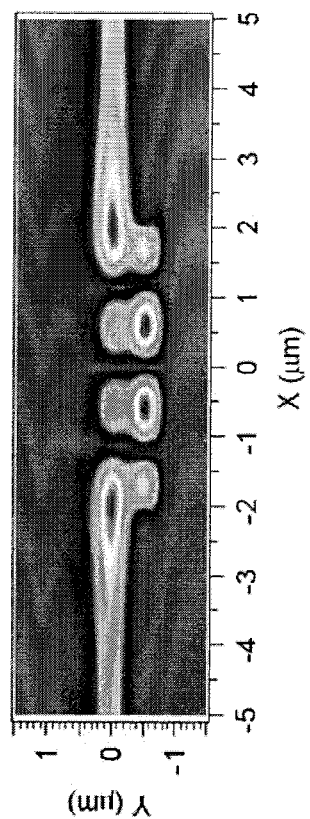
FIG.13D TE$_{30}$MODE
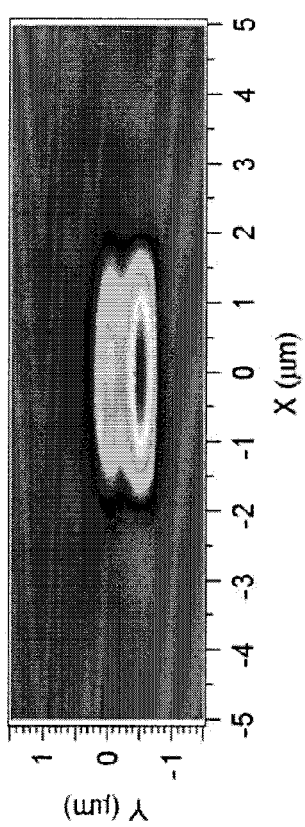
FIG.13A TE$_{00}$MODE
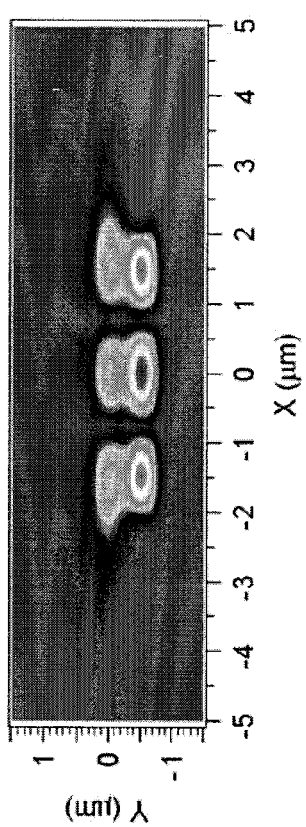
FIG.13C TE$_{20}$MODE

SEMICONDUCTOR LASER DEVICE

CROSS-REFERENCE TO RELATED APPLICATION

This application is based upon and claims the benefit of priority from Japanese Patent Application No. 2014-057279, filed on Mar. 19, 2014, the entire contents of which are incorporated herein by reference.

FIELD

Embodiments described herein relate generally to semiconductor laser devices.

BACKGROUND

Silicon (Si) photonics technology is about to enable optical interconnection devices and transmit/receive circuits to be integrated at high densities and mass-produced at low costs. However, light sources made of an indirect transition material, such as Si, SiGe or Ge, exhibit extremely low emission efficiency. Therefore, semiconductor lasers that have a light-emitting layer made of a III-V semiconductor material are commonly used for light sources. When a III-V semiconductor laser is mounted on a Si substrate or an SOI (silicon on insulator) substrate, a flip-chip mounting technique can be used. With this method, however, light emitted from the semiconductor laser cannot be easily coupled to a fine Si waveguide with low loss and a high yield. In order to overcome this disadvantage, Si hybrid lasers have been proposed. These lasers employ an integrated waveguide structure in which a III-V active layer is bonded to a Si substrate directly or with an ultrathin insulating layer therebetween.

When optical signals are transmitted stably at as fast as several to several tens of Gbps, single-mode lasers, such as distributed feedback (DFB) or distributed Bragg reflector (DBR) lasers, are desirably used. It can be said that lasers of these types are suitably integrated on a Si substrate, because they do not require reflecting end surfaces that cannot be formed easily on the Si substrate, and enables emitted light to be coupled stably to a Si waveguide at high efficiency with a taper structure. When lasers having a wide tunable wavelength range are required, DBR lasers, including SSG (super-structured grating) DBR lasers and SG (sampled-grating) DBR lasers, in which the refractive index of the diffraction grating provided in a passive waveguide is tunable, are desirably used. However, if being applied to on-chip optical interconnections that do not need a wide tunable wavelength range, DFB lasers are more desirable in terms of their compactness and efficiency.

In order to avoid an instability of longitudinal modes that would be caused due to an occurrence of axial hole burning upon a high injection, it is desirable that a λ/4 phase shifter be provided in a DFB laser at its center and the product κL of the coupling coefficient κ of the diffraction grating and the resonator length L be set to 1.25 or so. A DFB laser needs to oscillate in a fundamental (zero-order) transverse mode, so that its emitted light can be coupled to a Si waveguide efficiently. In addition, it is necessary to sufficiently attenuate return light reflected at the output end of the waveguide such that mode instability can be avoided.

The majority of Si hybrid DFB lasers reported are of Si guiding type (evanescent lasers) in which light that propagates along a waveguide formed on a Si layer is evanescently coupled to a III-V active layer. In a typical Si guiding type of laser, a thick Si rib waveguide (more than 500 nm thick) is used to confine a major part of the fundamental mode in the Si waveguide, and the current path in a wide III-V mesa is constricted so as to align with the Si rib waveguide by means of proton ion implantation, for example. Si guiding types of lasers configured above have advantages in that: emitted light can easily be coupled to an output Si rib waveguide; the contact resistance to an electrode on a wide III-V mesa is low; and heat can be dissipated via the wide III-V mesa. However, they have disadvantages in that: the confinement factor Γ of the active layer is small, which results in low modal gain and slope efficiency; the coupling coefficient κ of the diffraction grating tends to be excessively large (>100 cm$^{-1}$, typically), which results in a strong axial hole burning; and a thick Si rib waveguide cannot be bent with a small radius, which makes it difficult to increase the density of optical interconnections.

A supermode type of Si hybrid laser has been proposed as a structure that improves the above disadvantages. In this type of laser, light is primarily confined in a III-V semiconductor waveguide in the laser section, and it is gradually transferred into an output Si waveguide in an adjoining coupling section. In a DFB laser, however, a Si waveguide with a diffraction grating thereon is required also in the laser section. Because of a complex waveguide structure extending over the III-V semiconductor waveguide and the Si waveguide, multiple modes exist therein. When difference in effective indexes of the modes in the two original waveguides is small, these two modes are combined and transformed into a pair of supermodes. In order to achieve high slope efficiency, it is required that the laser oscillates in the fundamental supermode with a relatively large Γ and κ. In this case, unfortunately, in addition to higher-order modes in the active layer having a large Γ, higher-order modes in the Si waveguide having a large κ and the other supermode having a relatively large Γ and κ compete with the fundamental mode. Furthermore, there is difficulty controlling the characteristics of the supermode, because the confinement factor Γ and coupling coefficient κ of the supermode are highly sensitive to structural parameters.

A III-V guiding type of Si hybrid laser has been proposed as a structure that can improve the above disadvantage. In this type of laser, a Si waveguide in the laser section is replaced by a Si slab layer. Since no guided mode exists in the Si slab layer, modes can be controlled much easier than supermode types. By forming a diffraction grating on a surface of the Si slab layer under the center of a III-V mesa (at a location of a node of the first-order mode) such that it is sufficiently narrower than the III-V mesa, the coupling coefficient of the diffraction grating for the first-order mode (abbreviated below as a "first-order mode coupling coefficient") can be made sufficiently smaller than that for the fundamental (zero-order) mode. If the III-V mesa width is decreased such that second and higher order modes do not appear, single mode oscillation in the fundamental transverse mode is easily realized. Since the confinement factor Γ in this type of laser is higher than that in a Si guiding type as described above, the slope efficiency is higher. Moreover, the coupling coefficient of the diffraction grating κ can be controlled easily within a proper range. Therefore, a stable single mode operation without axial hole burning is realized over a wide range of operating condition. By utilizing a thin Si slab layer, light can be emitted to a Si waveguide with a small cross section (e.g., with 220 nm thick and 450 nm wide) through an output taper. This is advantageous to downsize optical integrated circuits and increase their package densities.

In a Si hybrid laser, a thick buried SiO$_2$ (BOX (buried oxide)) layer (with more than 1 µm thick) is formed under a top Si layer. This layer disadvantageously increases the thermal resistance and degrades the thermal characteristics. It is reported that a Si guiding type of Si hybrid laser that employs a thermal shunt structure in which polysilicon is embedded in the BOX layer under a semi-insulating part of the InP mesa can decrease its thermal resistance to 40 K/W or less. In a III-V guiding type of Si hybrid laser, however, the III-V mesa cannot be widened and accordingly its thermal resistance cannot be decreased easily. It is thus necessary to improve the thermal characteristics of III-V guiding types of Si hybrid lasers.

BRIEF DESCRIPTION OF THE DRAWINGS

FIGS. 3A to 3E show transverse electric (TE) modes in the first embodiment;

FIGS. 10A to 10C show TE modes in the second embodiment;

FIGS. 13A to 13D show TE modes in the third embodiment;

DETAILED DESCRIPTION

Figure 1:
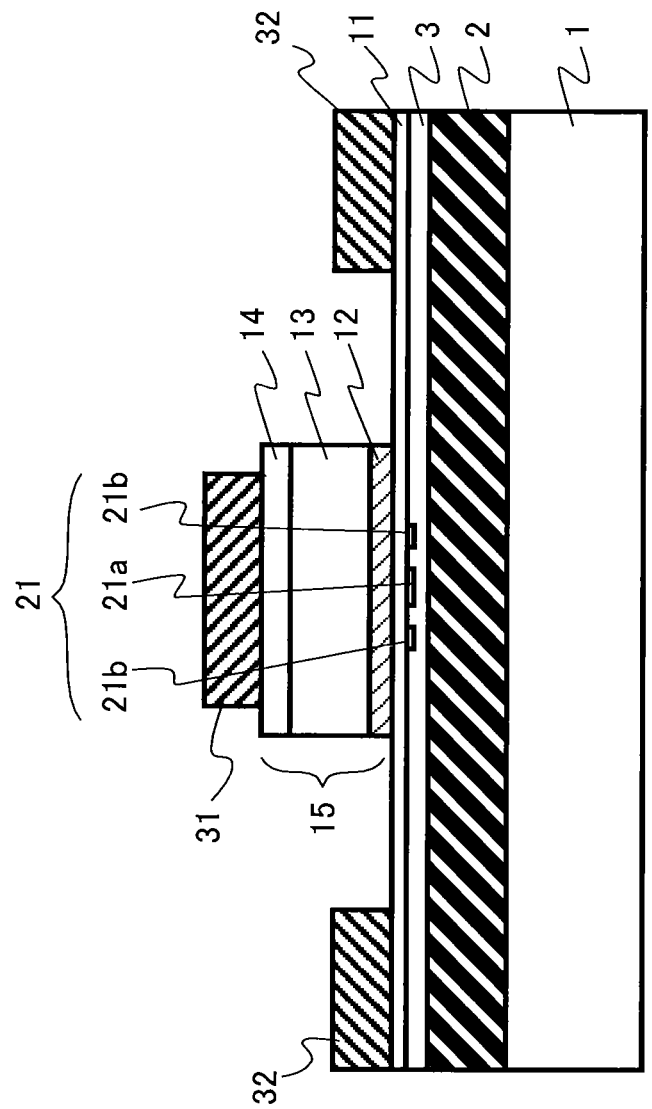
FIG. 1 is a schematic sectional view of a semiconductor laser device in a first embodiment.

A semiconductor laser device according to an embodiment includes: a compound semiconductor layer including an active layer from which laser light is emitted, the compound semiconductor layer having a first mesa structure; and a silicon layer bonded with the compound semiconductor layer, a diffraction grating being provided on a surface of the silicon layer which faces the compound semiconductor layer, the diffraction grating including a main diffraction grating and two sub-diffraction gratings, the main diffraction grating extending in a longitudinal direction of the first mesa structure, the sub-diffraction gratings being disposed on both sides of the main diffraction grating.

Embodiments will be described below with reference to the accompanying drawings. It should be noted that there are cases where a lateral-to-vertical ratios, sizes and the like in the drawings differ from real ones for the sake of convenience.

Herein, identical or similar constituent elements are denoted by the same reference characters; members and the like that have been described once will not be described as appropriate.

Herein, the words "over," "above," "under" and "below" are used to indicate the positional relationship of components and the like for the sake of convenience; however they do not indicate a relation with the direction of the gravitational force.

First Embodiment

A semiconductor laser device in this embodiment includes a compound semiconductor layer that has an active layer from which laser light is emitted and employs a first mesa structure. In addition, this semiconductor laser device includes a silicon layer bonded with the compound semiconductor layer, and a diffraction grating is formed on the surface of the silicon layer which faces the compound semiconductor layer. This diffraction grating includes a main diffraction grating that extends in a longitudinal direction of the first mesa structure and two sub-diffraction gratings formed on both sides of the main diffraction grating.

FIG. 1 is a schematic sectional view of the semiconductor laser device in this embodiment. The semiconductor laser device in this embodiment employs a III-V guiding type of Si hybrid DFB laser. FIG. 1 illustrates the cross section that is vertical to a direction along which a resonator extends.

The semiconductor laser device includes: a Si substrate 1; a SiO$_2$ layer 2 formed over the Si substrate 1; and a Si layer (silicon layer) 3 formed over the SiO$_2$ layer 2. Furthermore, an n-InP (n-type InP) layer 11, an active/guide layer (also referred to below as an active layer) 12, a p-InP (p-type InP) cladding layer 13 and a p-InGaAs contact layer 14 are stacked over the Si layer (silicon layer) 3 to form a compound semiconductor layer having a mesa (first mesa structure) 15.

The compound semiconductor layer is optically coupled to the Si layer 3 to form an integrated optical waveguide. In this embodiment, the compound semiconductor layer is in direct contact with the Si layer 3.

A diffraction grating 21 is formed on a surface of the Si layer (silicon layer) 3 which faces the compound semiconductor layer. The diffraction grating 21 includes a main diffraction grating 21a and two sub-diffraction gratings 21b and 21b; the main diffraction grating 21a is formed so as to extend in a longitudinal direction of the first mesa structure 15, and the sub-diffraction gratings 21b and 21b are formed on both sides of the main diffraction grating 21a.

A p-electrode 31 is formed over the p-InGaAs contact layer 14; n-electrodes 32 and 32 are formed on the n-InP layer 11 at a distance from the first mesa structure 15. A description will be given below of specific example of a structure of this embodiment.

The compound semiconductor layer is bonded to the surface of the SOI (Silicon On Insulator) substrate. Specifically, components of this compound semiconductor layer are the n-InP layer 11 with a thickness of 225 nm, the active layer 12 with a thickness of 300 nm, the p-InP cladding layer 13 with a thickness of 950 nm, and the p-InGaAs contact layer 14 with a thickness of 200 nm. Components of the SOI substrate are the Si substrate 1, the buried silicon dioxide (BOX) layer 2 with a thickness of 1 µm, and the top Si layer (silicon layer) 3 with a thickness of 220 nm.

The active layer 12, the p-InP cladding layer 13 and the p-InGaAs contact layer 14 in the compound semiconductor layer are etched so as to form the mesa (first mesa structure) 15 with a width of 3.3 µm. Both the Si layer 3 and the compound semiconductor layer, the top of which has been processed to form the mesa 15, constitute an integrated optical waveguide.

The Si/SiO$_2$ diffraction grating 21 is formed on the surface of the Si layer 3 directly below the mesa 15. Components of this diffraction grating are the main diffraction grating 21a and the sub-diffraction gratings 21b and 21b.

The p-electrode 31 is formed on the mesa 15, and the n-electrodes 32 and 32 are formed on the n-InP layer 11 at some distance from the mesa 15. Through these electrodes 31, 32 and 32, current can be injected into the active layer 12. When the current is injected into the active layer 12, a laser oscillation occurs, and then laser light is emitted from the active layer 12.

The Si hybrid DFB laser in this embodiment is fabricated through the following processing. An InP substrate, a surface of which has an epitaxially grown layer formed thereon, is bonded directly to an SOI substrate in which output optical waveguides and a diffraction grating 21 are formed in a top Si layer 3, by means of a direct wafer bonding technique. Then, the InP substrate is removed, and the remaining epitaxially grown layer is processed into a mesa shape in accordance with a pattern formed on the top Si layer 3. After that, electrodes and the like are formed.

In fact, the side wall of the mesa 15 and the exposed surface area of the n-InP layer 11 are covered with SiO$_2$ and polyimide. Electric wirings are formed on a surface of the polyimide and in via holes formed therein. Since such structures common in semiconductor lasers are not related to the core of this embodiment, they are not illustrated in the drawings and will not be described either.

For example, the active layer 12 has a structure in which a strain-compensated quantum well active layer (ten wells) is sandwiched by InGaAlAs composition gradient waveguide layers. The strain-compensated quantum well active layer is formed by alternately stacking compressive strained In$_{0.71}$Ga$_{0.11}$Al$_{0.18}$As well layers with a thickness of 6 nm and tensile strained In$_{0.49}$Ga$_{0.21}$Al$_{0.30}$As barrier layers with a thickness of 10 nm. The gain of the quantum well active layer peaks at a wavelength of approximately 1.3 µm. Since the compressive strained well layers are used, the active layer 12 acquires a gain for TE (transverse electric) modes upon a current injection. Although no impurities are intentionally doped into the quantum well active layer and parts disposed just above and below the quantum well active layer, a part of the lower composition gradient waveguide layer in the active layer which is in contact with the n-InP layer 11 assumes an n-type. A part of the upper composition gradient waveguide layer which is in contact with the p-InP layer 13 assumes a P-type having a carrier density of $10^{17}$ cm$^{-3}$ or so.

If the n-InP layer 11 has a high resistance, current is concentrated around the side wall of the mesa 15, in which case a sufficient gain may not be acquired at the center of the mesa 15. For this reason, the n-InP layer 11 in this embodiment has a carrier density of (2 to 3)×$10^{18}$ cm$^{-3}$ and a thickness of 225 nm that are slightly higher and thicker, respectively, compared with typical Si hybrid lasers.

The acceptor concentration of the p-InP cladding layer 13 is graded so that the absorption of light is gradually reduced toward the active layer. The p-electrode 31 is made of a non-alloy contact such as Ti/Pt/Au; the thickness of the p-InGaAs contact layer 14 having a low thermal conductivity is set to a relatively small value. Note that detailed structures as described above may be modified in various ways as needed.

Figure 2:
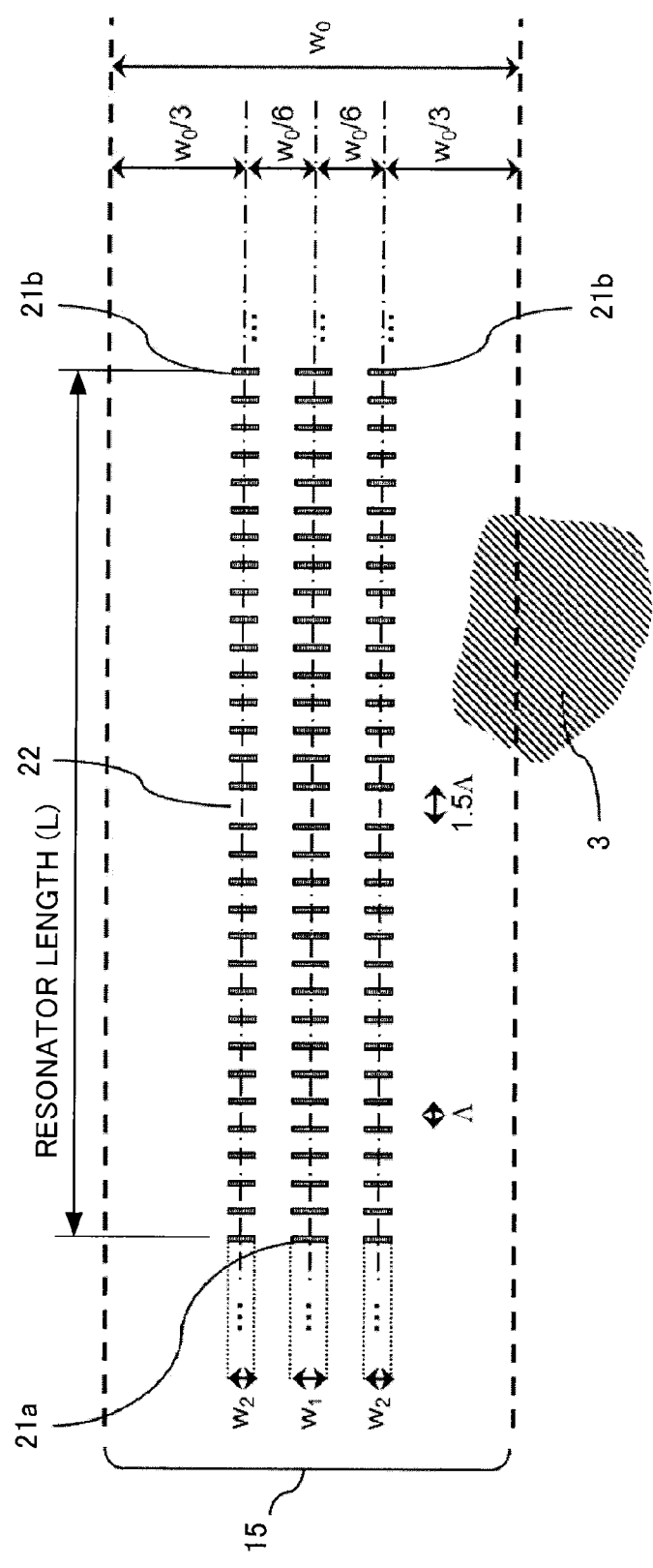
FIG. 2 illustrates the layout of a diffraction grating in the first embodiment.

FIG. 2 illustrates the layout of the diffraction grating in this embodiment. More specifically, this drawing illustrates the layout of the diffraction grating 21 formed on the surface of the Si layer 3 under the mesa 15.

The diffraction grating 21 is formed on the surface of the Si layer 3 and includes recesses filled with SiO$_2$. The recess forming the diffraction grating 21 are disposed at a period Λ of 200 nm and each have a depth of 40 nm. Cross sectional shape of the recess is nearly rectangular. Silicon filling factor (ratio of the part where the silicon is not recessed) is preferably set to 70% (Si: 140 nm and SiO$_2$: 60 nm).

As illustrated in FIG. 2, components of the diffraction grating 21 are the three diffraction gratings. Specifically, the main diffraction grating 21a extends in a longitudinal (z) direction of the first mesa structure 15; the two sub-diffraction gratings 21b are formed on both sides of the main diffraction grating 21a.

The respective periods and phases of the three diffraction gratings coincide with one another. For example, if three diffraction gratings are patterned by means of electron beam lithography, the pattern is drawn such that the centers of all the grooves of each diffraction grating are aligned on a straight line perpendicular to the propagation direction of light (z axis). In this way, the respective periods and phases of the three diffraction gratings can be made to coincide with one another. Each diffraction grating in this embodiment has a constant period; however in an embodiment in which a period is modulated in the longitudinal (z) direction, respective grooves in three diffraction gratings should be arranged so as to have the same period and phase at a respective z position.

The main diffraction grating 21a is formed on the line dividing the mesa (first mesa structure) 15 in half, whereas the sub-diffraction gratings 21b and 21b, which are arranged on both sides of the main diffraction grating 21a, are formed on respective lines dividing the mesa (first mesa structure) 15 into three equal parts. In other words, the main diffraction grating 21a is disposed directly below the central point of the first mesa structure 15 in a width direction thereof, whereas the sub-diffraction gratings 21b and 21b are disposed directly below respective points at which the first mesa structure 15 is divided into three equal parts in the width direction. A width $w_1$ of the main diffraction grating 21a is set to 5% of the width $w_0$ of the mesa (first mesa structure) 15, whereas a width $w_2$ of each sub-diffraction grating 21b is set to 3% of the mesa width $w_0$.

When the mesa width $w_0$ is set to 3.3 μm, the widths $w_1$ and $w_2$ become 165 nm and 99 nm, respectively. The DFB laser is provided with a resonator having a length (L) of 240 μm, and a λ/4 phase shifter 22 is formed at the center of the resonator. In this case, the resonator length (L) is defined as a length of the diffraction grating 21 in the longitudinal direction of the mesa (first mesa structure) 15.

The λ/4 phase shifter 22 is formed by setting the distance between corresponding lattices in the diffraction grating 21 to 1.5 times the period Λ. Without the λ/4 phase shifter 22, two longitudinal modes at the long and short wavelength edges of the stop band compete each other, since these two modes have substantially the same threshold gain (a modal gain required for oscillation). With the λ/4 phase shifter 22, a longitudinal mode appears at the center of the stop band, or at the Bragg wavelength. The threshold gain of this mode is lower than that of any side mode (longitudinal mode) outside the stop band. Thus, the laser can oscillate in a single longitudinal mode at the center of the stop band as long as disturbance that would be caused, for example, due to light reflected at the end facet of the output waveguide is sufficiently suppressed. If the phase shift amount of the λ/4 phase shifter 22 somewhat deviates from λ/4, the wavelength of a longitudinal mode created in the stop band is slightly shifted from the Bragg wavelength. Even in this case, the laser can still oscillate in a single longitudinal mode unless the deviation of the phase shift amount excessively increases. The occurrence of axial hole burning, however, varies the phase shift amount, displacing the location (wavelength) of a mode within the stop band. Herein, the λ/4 phase shifter represents a phase shifter provided to cause the laser to oscillate in a single longitudinal mode within a stop band; its phase shift amount does not necessarily have to be just λ/4.

FIGS. 3A to 3E show TE modes (transverse modes) in the first embodiment. When the mesa width is set to 3.3 λm, fives TE modes, or a zero-order ($TE_{00}$) mode, a first-order ($TE_{10}$) mode, a second-order ($TE_{20}$) mode, a third-order ($TE_{30}$) mode and fourth-order ($TE_{40}$) mode as shown in FIGS. 3A to 3E, respectively, are present. Herein, a $TE_{ij}$ mode is defined as a mode having an i number of nodes in a lateral direction and a j number of nodes in a thickness direction.

For the $TE_{00}$ mode, or the fundamental mode, the confinement factor $\Gamma_{QW}$ of the quantum well layer is 14.3%. For each of $TE_{10}$ to $TE_{30}$ modes, the confinement factor $F_{QW}$ is 13.2 to 14.1%, which is slightly smaller than that for the fundamental mode. The highest-order $TE_{40}$ mode is a leaky mode which trails toward both sides, or toward the Si layer 3 ($\Gamma_{QW}$=7.9%). Since this mode does not contribute to an oscillation, it will not be described below.

In the coordinate system in FIGS. 3A to 3E, the origin is set at the center of the active layer 12. The center (X=0, Y=−0.395) of the main diffraction grating 21a is positioned at the node of the $TE_{10}$ mode and one of the nodes of $TE_{30}$ mode. The centers (X=±0.55, Y=−0.395) of the sub-diffraction gratings 21b and 21b are positioned at the respective nodes of $TE_{20}$ mode. For this reason, the $TE_{10}$ and $TE_{30}$ modes are hardly diffracted by the main diffraction grating 21a; the $TE_{20}$ mode is hardly diffracted by the sub-diffraction gratings 21b and 21b.

Since the side wall of the mesa 15 in this embodiment is vertical, the mesa width (the width of the first mesa structure 15) is uniquely specified. Here, a possible difficult case will be described. Assuming that the side wall of the mesa 15 is inclined, the mesa width (the width of the first mesa structure 15) can be defined as the width of the bottom of the mesa 15, or the width of a portion the closest to the Si layer 3 of the mesa 15.

If a mesa has a symmetrical shape, a node of the $TE_{10}$ mode is always located at the center of the mesa 15. If the mesa 15 has an inclined side wall, the nodes of the $TE_{20}$ mode are located in the vicinity of regions at which the width of the bottom of the mesa 15 or the width of the interface of the active layer 12 which is closer to the Si layer 3 is divided into three equal parts.

In fact, the bottom of the mesa cannot be defined easily, such as when a mesa does not have a symmetrical shape, a mesa has a side wall with large steps, or the bottom of a mesa, including an active layer, has a skirt shape. Even in such cases, the locations of the nodes of each mode can be easily identified with, for example, a commercially available mode solver.

In this embodiment, the width $w_2$ of each sub-diffraction grating 21b is set to 0.6 times the width $w_1$ of the main diffraction grating 21a such that the coupling coefficient κ of the $TE_{10}$ mode is nearly equal to that of the $TE_{20}$ mode. More specifically, the coupling coefficient κ for the fundamental ($TE_{00}$) mode is 51.7 $cm^{-1}$. In contrast, the coupling coefficients κ of $TE_{10}$, $TE_{20}$, $TE_{30}$ and $TE_{40}$ modes are 25.4, 26.3, 26.5 and 27.0 $cm^1$, respectively, all of which do not exceed 52.2% of the coupling coefficient κ for the fundamental mode.

In order to avoid instability of modes in a DFB laser which would be caused due to an occurrence of axial hole burning upon a current injection, a product κL desirably falls within the range from 1 to 1.5 inclusive. Here, the product κL is obtained by multiplying a coupling coefficient κ for a fundamental (zero-order) mode in the diffraction grating 21 by a resonator length L defined as the length of the diffraction grating 21 in the longitudinal direction of the first mesa structure 15. More preferably, the product κL is set to approximately 1.25. In this embodiment, the resonator length L is set to 240 μm, and the product κL for the fundamental mode accordingly becomes 1.24. Thus, axial hole burning is reduced to a substantial minimum.

The products $κ_L$ for the higher-order modes fall within the range of 0.61 to 0.65. The confinement of light in the higher-order modes within a resonator is weaker than that for the fundamental mode. In other word, photons in higher-order modes have a shorter lifetime. In addition, the respective confinement factors $\Gamma_{QW}$ for the $TE_{00}$ to $TE_{30}$ modes rarely differ from one another. Therefore, the DFB laser oscillates only in the fundamental mode in which photons have a long lifetime and the gain for the oscillation is minimized.

Figure 4A:
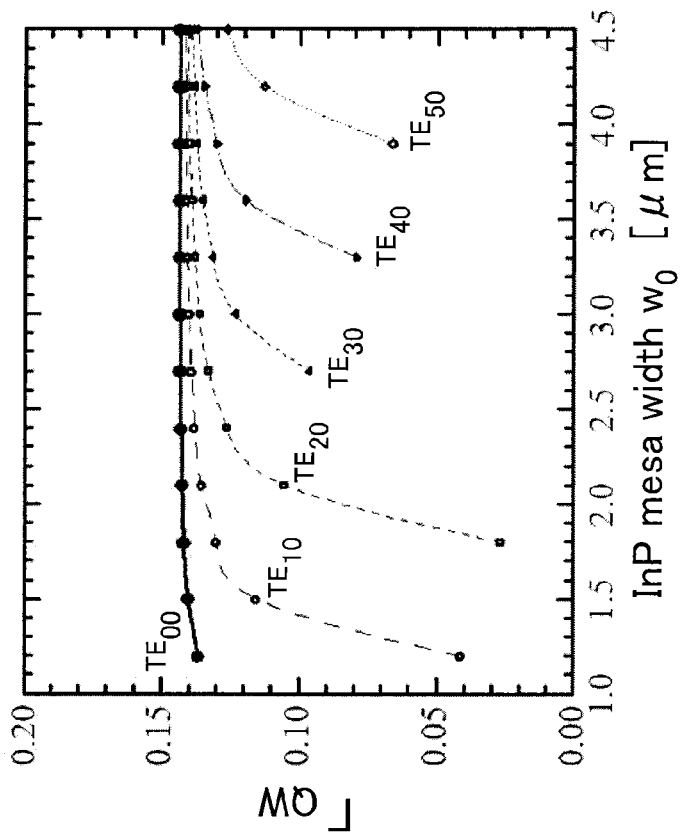
FIG. 4A shows a calculated result of the coupling coefficients κ for TE modes in the first embodiment.
Figure 4B:
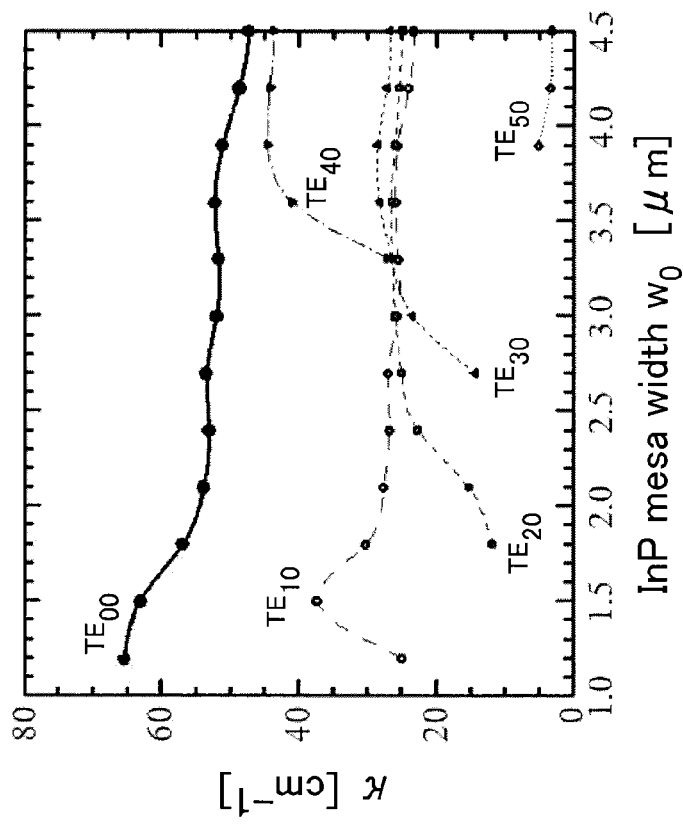
FIG. 4B shows a calculated result of the confinement factors $\Gamma_{QW}$ for the TE modes in the first embodiment.

FIG. 4A shows a calculated result of the coupling coefficients κ for TE modes in the first embodiment; FIG. 4B shows a calculated result of the confinement factors $\Gamma_{QW}$ for the TE modes in the first embodiment. More specifically, these drawings show the calculated results of (a) the coupling coefficient κ and (b) the confinement factor $\Gamma_{QW}$ of the quantum well when the width $w_0$ of the mesa 15 in the Si hybrid DFB laser in this embodiment is varied. The ratio $w_1/w_0$ of the width $w_1$ of the main diffraction grating 21a to the mesa width $w_0$ is set to a constant value, more specifically, 0.05. The ratio $w_2/w_0$ of the width $w_2$ of each sub-diffraction grating 21b to the mesa width $w_0$ is set to a constant value, more specifically, 0.03.

Three to five TE modes are present within the mesa width range of 1.8 to 3.3 μm, but the coupling coefficients κ for these higher-order modes are reduced to substantially half that for the fundamental ($TE_{00}$) mode within this range. The confinement factor $\Gamma_{QW}$ for the fundamental mode has a substantially constant value (approximately 14%) independently of the mesa width.

The confinement factor $\Gamma_{QW}$ for each higher-order mode is low at its rising part, because its light distribution at both ends trails toward the Si slab layer. However, as the mesa width increases, the light distribution at both ends is shifted toward the active layer. As a result, the confinement factor $\Gamma_{QW}$ for each higher-order mode approaches that of the fundamental mode. When the mesa width exceeds 3.5 μm, the coupling coefficient κ and the confinement factor $\Gamma F_{QW}$ for the $TE_{40}$ mode becomes comparative to those for $TE_{10}$ mode, in which case the modes are prone to compete with each other.

Figure 5:
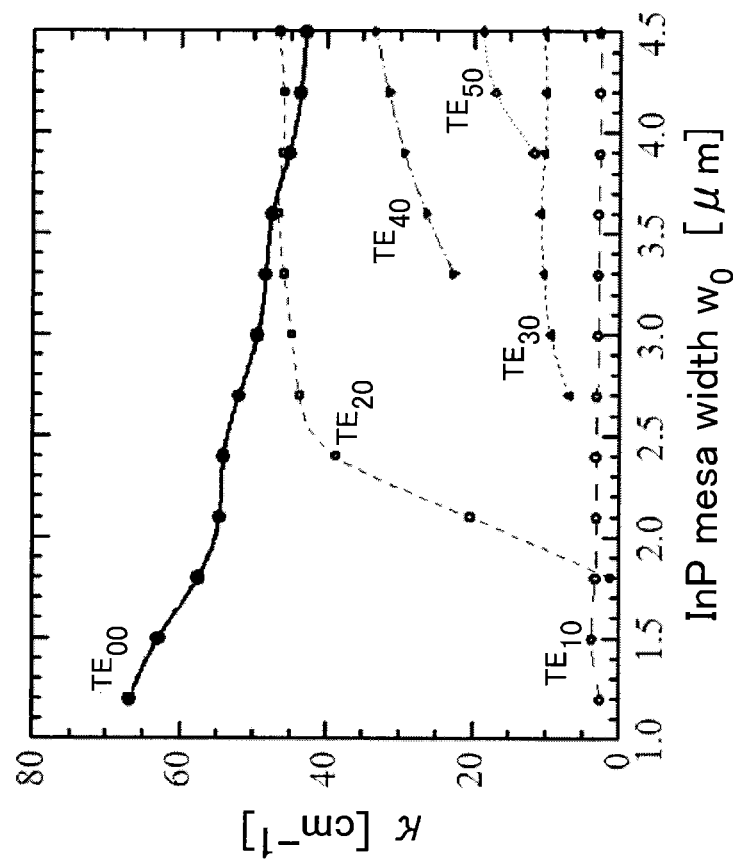
FIG. 5 shows a calculated result of the coupling coefficients κ for the TE modes in a comparative embodiment.

FIG. 5 shows a calculated result of the coupling coefficients κ for the TE modes in a comparative embodiment. More specifically, FIG. 5 shows the coupling coefficients κ of a comparative laser for the TE modes, in which a single diffraction grating whose width is set to 12% of the mesa width is formed at the center of the mesa. Note that the confinement factors $\Gamma_{QW}$ for the TE modes in a well layer do not greatly differ from those in FIG. 4B.

The coupling coefficients κ for the $TE_{10}$ and $TE_{30}$ modes in the comparative embodiment are lower than those in the first embodiment. However, when the mesa width exceeds 2.2 μm, the coupling coefficient κ and the confinement factor $\Gamma_{QW}$ for the $TE_{20}$ mode approach those for the fundamental mode, in which case the modes are prone to compete with each other.

According to the first embodiment, the range of the mesa width in which transverse modes do not compete with one another can be increased to approximately 1.5 times that when only one diffraction grating is formed at the center of the mesa.

From the viewpoint of setting the coupling coefficient κ for each TE mode and the product κL of the coupling coefficient κ of the diffraction grating 21 and the resonator length L to appropriate values so that a good single mode oscillation is achieved, the width $w_1$ of the main diffraction grating 21a is desirably set to 10% or less of the width of a portion of the first mesa structure 15 which faces the Si layer 3. Furthermore, the width $w_2$ of each sub-diffraction grating 21b is desirably set to smaller than the width $w_1$ of the main diffraction grating 21a and larger than half the width of the main diffraction grating 21a.

Figure 6:
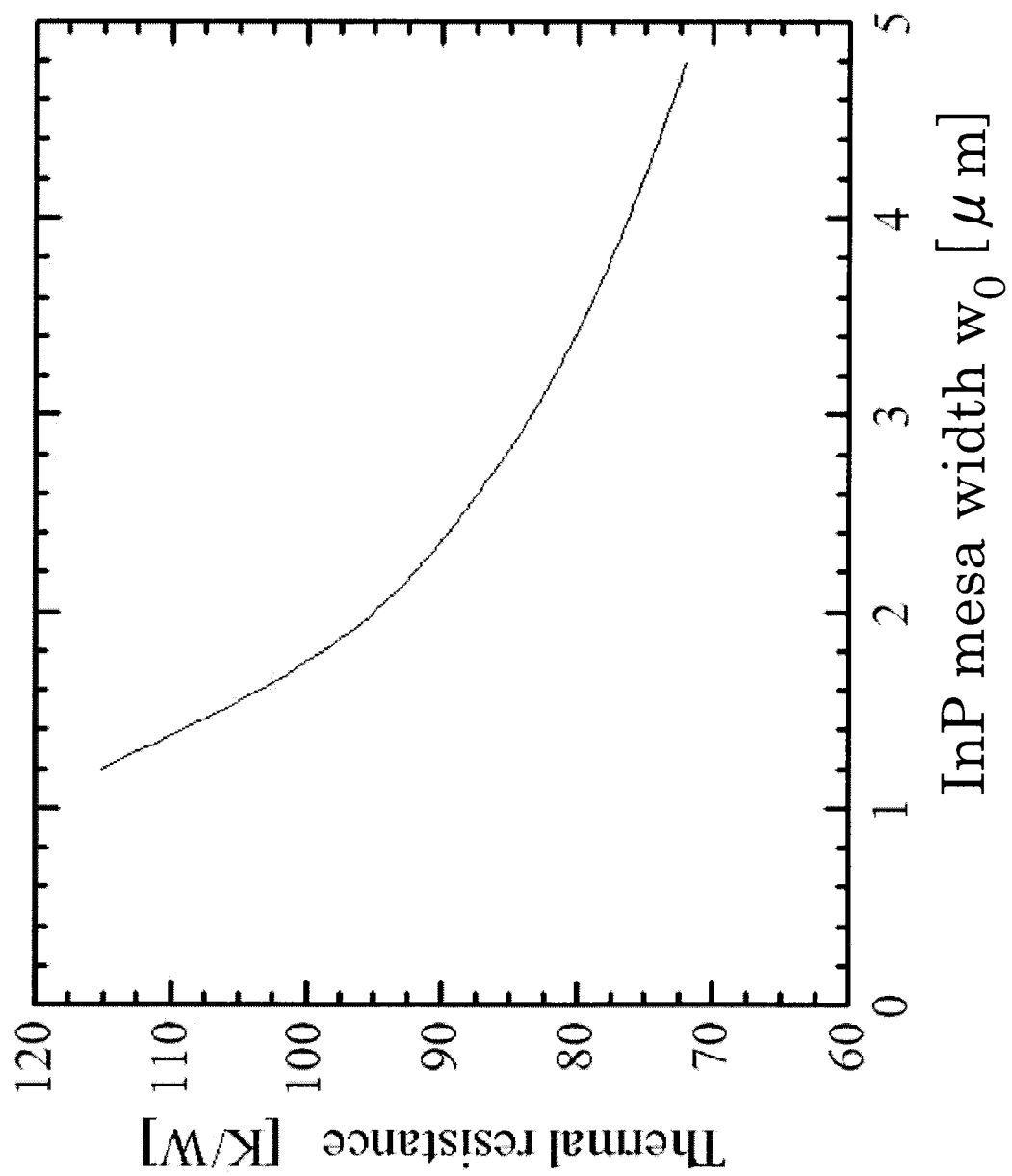
FIG. 6 shows a calculated result of the thermal resistance as a function of a mesa width in the first embodiment.

FIG. 6 shows a calculated result of a thermal resistance as a function of a mesa width in this embodiment. In this embodiment, no special measures to decrease a thermal resistance, such as providing a polysilicon thermal shunt, are taken. According to the Si hybrid DFB laser in this embodiment, the increase in the mesa width can decrease the thermal resistance, improving the thermal characteristics. In addition, the increase in the mesa width can relatively reduce the influence of scattering loss due to the surface roughness and surface recombination on the sidewalls of the mesa 15. Moreover, it is possible to increase a tolerance for the relative position between the Si layer 3 and the mesa 15.

For lasers having the same resonator length, as their mesa widths increase, their operating currents increase but their output powers also increase. Suppose a case where lights emitted from both ends of a laser are separated into multiple channels, and modulated by Si optical modulators, and then transmitted in parallel. If the mesa width can be increased, many more parallel channels can be used. In such a concentrated light source system, the output power, wavelength and the like can be controlled easier than a system in which multiple light sources are prepared for respective channels.

Alternatively, by increasing the mesa width, the resonator length required to output the same power can be decreased. In this case, it is necessary to take some measures, such as those to increase the gain per unit length by increasing the number of wells and to increase the coupling coefficient of the diffraction grating, but the decrease in the resonator length makes it possible to increase the integration density of an optical device and decrease an area influenced by a temperature rise.

In the Si hybrid DFB laser in this embodiment, both ends of the resonator are connected in series to an output taper structure through which emitted light is coupled to a Si waveguide 5 having a mesa width of 600 nm.

The output taper structure is not an essential component in this embodiment. However, an exemplary output taper structure will be described for the purpose of indicating that light emitted from the Si hybrid DFB laser can be coupled to the Si waveguide. Note that the output taper structure that will be described below is exemplary; other output taper structures are conceivable.

Figure 7:
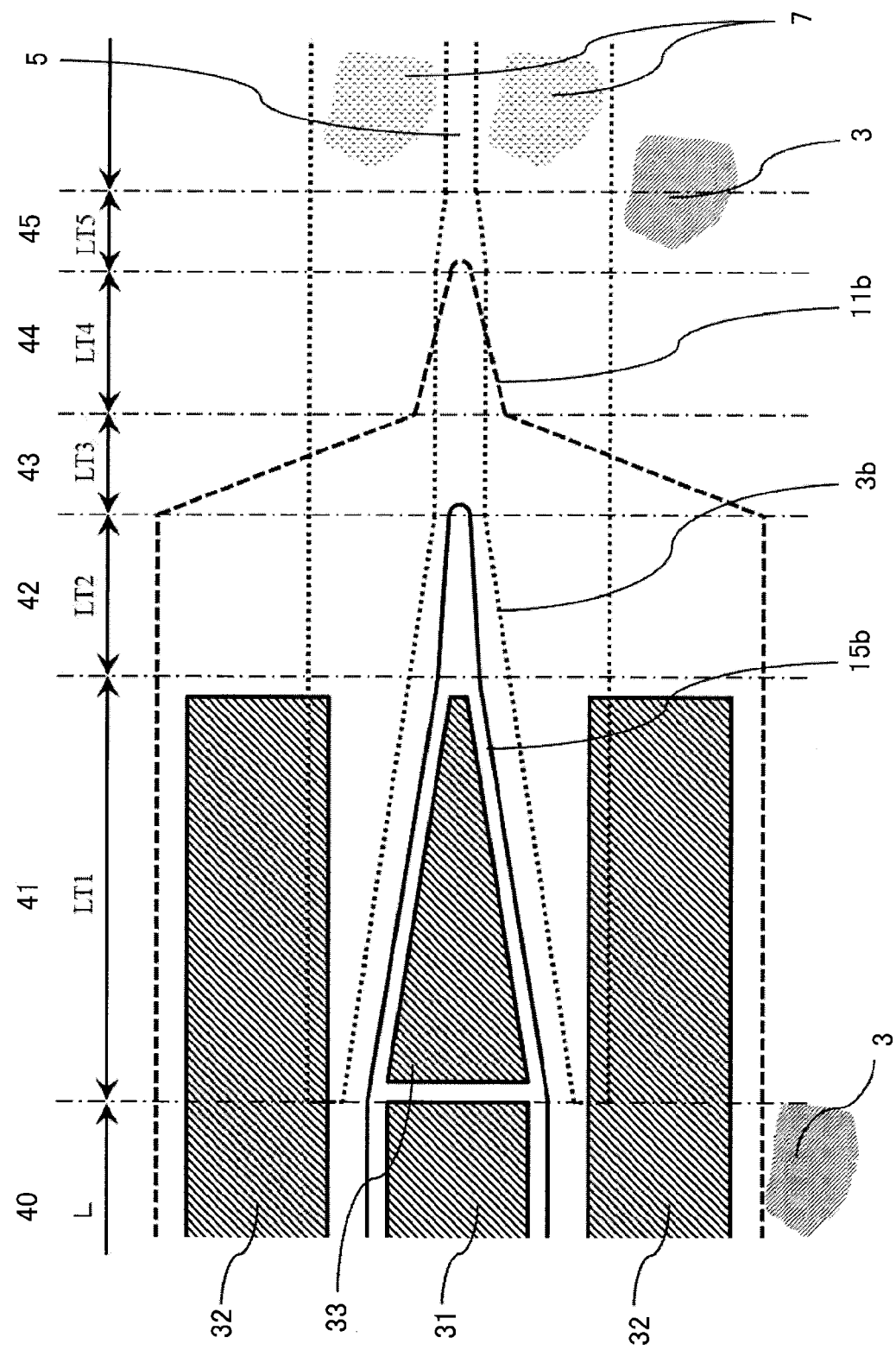
FIG. 7 is a schematic plan view of an output taper structure in the first embodiment.

FIG. 7 is a schematic plan view of the output taper structure in this embodiment. For convenience of explanation, the longitudinal side of the waveguide is greatly shrunk with respect to the lateral side thereof, and accordingly individual parts greatly differ in size and shape from real ones. In the drawing, solid, broken and dotted lines represent the side walls of the InP mesa 15, the n-InP layer 11 and the Si layer 3, respectively.

The taper structure has a five stage configuration, including a first taper section 41, a second taper section 42, a third taper section 43, a fourth taper section 44 and a fifth taper section 45 arranged in this order in a direction away from a DFB laser section 40. An end of the fifth taper section 45 is connected to the Si waveguide 5 having a thickness of 220 nm and a width of 600 nm. Here, the lengths of the first to fifth taper sections are denoted by LT1, LT2, LT3, LT4 and LT5, respectively; the total taper length that is the sum of the lengths LT1 to LT5 is denoted by LTT.

The InP mesa 15 in the DFB laser section 40 is 3.3 μm wide, and a mesa taper 15b is narrowed to 0.8 μm and 0.4 μm in the first taper section 41 and the second taper section 42, respectively, and finally terminated. The n-InP slab layer 11 extends to the second taper section 42 on both sides of the mesa 15. This n-InP layer 11 is narrowed to 1.8 μm in the third taper section 43, and a taper 11b is further narrowed to be 0.4 μm in the fourth taper section 44 and finally terminated. The terminated surfaces are processed into a shape in which they are not perpendicular to the propagation direction of light in order to suppress reflected light that will be returned to the DFB laser section 40.

The Si slab layer 3 in the DFB laser resonator 40 is connected to the Si waveguide 5 via a Si taper waveguide 3b extending from the first taper section 41 to the fifth taper section 45. The Si layers 3 lie at a region some μm away from both sides of the Si taper waveguide 3b and the Si waveguide 5, and $SiO_2$ cladding 7 is embedded and flattened between the waveguide and the Si layer 3.

The width of the Si taper waveguide 3b is linearly decreased from 4.3 to 1.0 μm between the input end of the first taper section 41 and the output end of the second taper section 42. This width is kept 1 μm in the third taper section 43 and the fourth taper section 44 and finally decreased to 600 nm in the fifth taper section 45.

Figure 8:
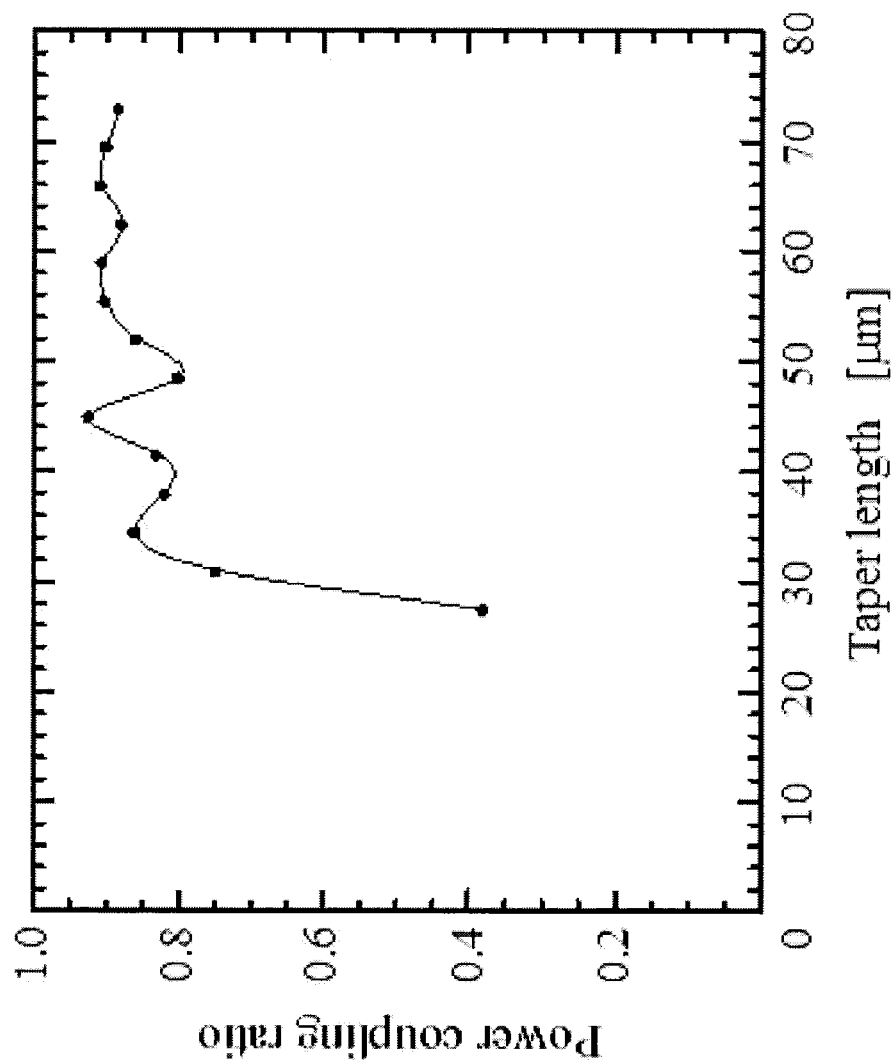
FIG. 8 shows an optical coupling characteristic of the output taper structure in the first embodiment.

FIG. 8 shows an optical coupling characteristic of the output taper structure in the first embodiment. This drawing shows the dependence of an optical power coupling ratio on the total length (LTT) of the tapers; the optical power coupling ratio represents a ratio of power coupled to the Si waveguide 5 to that emitted from the end of the Si hybrid DFB laser 40. This ratio is calculated by an FDTD (finite-difference time-domain) method on the assumption that the taper sections have no gain and no loss. In this exemplary calculation, the lengths of taper sections LT2, LT3, LT4 and LT5 are fixed values, namely, 8, 5, 7 and 4 µm, respectively, and only the length LT1 of the first taper section is variable.

Many higher-order modes are present in the taper sections, since silicon has a guiding structure. If the length LT1 decreases and the first taper section 41 is tapered sharply, the amount of light in the fundamental mode coupled to the Si waveguide 5 is decreased, because the amount of light that couples to $TE_{20}$ and $TE_{01}$ modes in the taper is increased and most part of them is scattered away at a midway. As the length LT1 increases, the power coupling ratio for light in the $TE_{00}$ mode increases at the end of the mesa taper 15b. However, a part of light in the $TE_{01}$ mode, which is scattered at the termination of the mesa taper 15b, interferes with light in the $TE_{00}$ mode. As a result, oscillatory components are superposed on the dependence of the power coupling ratio on the taper length. With LTT=45 µm (LT1=21 µm), the power coupling ratio amounts to 92.2%.

When the carrier density in an active layer is low, it acts as an absorption layer. For this reason, an extra p-electrode 33, which is isolated from the p-electrode 31 on the DFB laser section 40 (see FIG. 7), may be formed on the mesa 15 in the first taper section 41. In addition, the n-electrodes 32 and 32 on the n-InP layer 11 are formed so as to reach the first taper section 41. With this arrangement, the loss of light propagating in the first taper section 41 can be compensated by carrier injection into the active layer 12.

Although not illustrated in FIG. 7, the p-InGaAs contact layer 14 may be partially removed at the border between the DFB laser section 40 and the first taper section 41. In addition, in the second taper section 42, no electrodes may be formed and the active layer 12 may be left as an absorption layer. In the second taper section 42, the peak of the fundamental ($TE_{00}$) mode is shifted from the active layer 12 to the Si taper waveguide 3b; the peak of the $TE_{01}$ mode is shifted from the Si taper waveguide 3b to the active layer 12. As a result, a portion of light in the $TE_{01}$ mode is reflected at the tapered end. The absorption in the active layer 12 in the second taper section 42 attenuates the $TE_{01}$ mode that will be returned to the DFB laser resonator 40.

The embodiment described above can be modified in various ways. For example, the diffraction grating 21 in this embodiment is formed by embedding $SiO_2$ in grooves formed in the top Si layer 3; however, another material having a lower refractive index than Si may be embedded therein or the grooves may be filled with air or left in a vacuum. Instead of forming grooves, the Si layer 3 may be processed so that periodic bumps are left, thereby forming the diffraction grating 21.

In order to suppress an occurrence of axial hole burning, the product κL is preferably adjusted so as to fall within the range from 1 to 1.5 inclusive, more preferably, 1.25 or so.

According to this embodiment, even if the resonator length varies, the coupling coefficient κ can be adjusted relatively easily by, for example, changing the respective widths, depths, Si filling factors and cross-sectional shapes of the main diffraction grating 21a and each sub-diffraction grating 21b. This embodiment has been described regarding the case where the coupling coefficients κ for $TE_{10}$ and $TE_{20}$ modes are balanced by changing the widths of the main diffraction grating 21a and each sub-diffraction grating 21b; however another parameter such as a Si filling factor may be changed or multiple parameters may be changed at the same time. If the side wall of the diffraction grating 21 is not vertical, the width of the diffraction grating 21 and a Si filling factor therefor may be defined using values averaged in the depth direction.

As for the phase shifter of a diffraction grating, a plurality of independent phase shifters may be used instead of a single λ/4 phase shifter. Moreover, parameters for the diffraction grating, such as the period in a longitudinal direction of the resonator and the width, may be subjected to chirping, or the mesa width may be changed. Moreover, as long as a most part of a diffraction grating formed in a resonator is positioned at nodes of $TE_{10}$ and $TE_{20}$ modes so that the coupling coefficients κ for higher-order modes are sufficiently smaller than that for the fundamental mode, the diffraction grating may contain another part, such as a part in which only one of a main diffraction grating 21a and each sub-diffraction grating 21b is present or a part in which groves of a main diffraction grating 21a are connected to those of one or both of the sub-diffraction gratings 21b and 21b.

If a mesa is widened, current flowing through an active layer might be concentrated at the sides of the mesa close to n-electrodes and the gain at the center of the mesa therefore might decrease. Such a current concentration can be prevented by forming a p-InP cladding layer 13 in a mesa shape with its bottom being larger than its top, limiting a p-electrode 31 and a p-InGaAs contact layer 14 to center portion of the mesa, or increasing the resistance in the side portion of the p-InP cladding layer 13 using a proton implantation.

The description has been given of the embodiment of a Si hybrid DFB laser equipped with an InGaAlAs strained quantum well active layer which has a gain in a wavelength band of 1.3 µm. However, it is obvious that this embodiment is applicable to Si hybrid DFB lasers that are made of another III-V semiconductor material or have a gain in another wavelength band. Furthermore, compound semiconductor materials other than III-V semiconductor materials may be used.

This embodiment is also applicable to a structure in which a BOX layer in a SOI substrate is replaced by a $SiO_2$ layer formed on a Si substrate or another substrate by means of thermal oxidation or CVD (chemical vapor deposition) or another insulating layer and a structure in which a top Si layer in a SOI substrate is replaced by an amorphous Si layer. The amorphous Si layer may contain hydrogen, germanium or some other element.

According to a semiconductor laser device in this embodiment as described above, application of a diffraction grating 21 that includes a main diffraction grating 21a and sub-diffraction gratings 21b and 21b formed on both sides of the main diffraction grating 21a enables a mesa (first mesa structure) 15 to be widened. Consequently, it is possible to provide a semiconductor laser device that has good temperature characteristics. It is also possible to provide a semiconductor laser device that has a high efficiency and good mode stability.

Second Embodiment

A semiconductor laser device in a second embodiment differs from that in the first embodiment in that an insulating layer with a thickness equal to or less than 100 nm is further formed between a compound semiconductor layer and a silicon layer. Hereinafter, the same parts as in the first embodiment will not be described.

Figure 9:
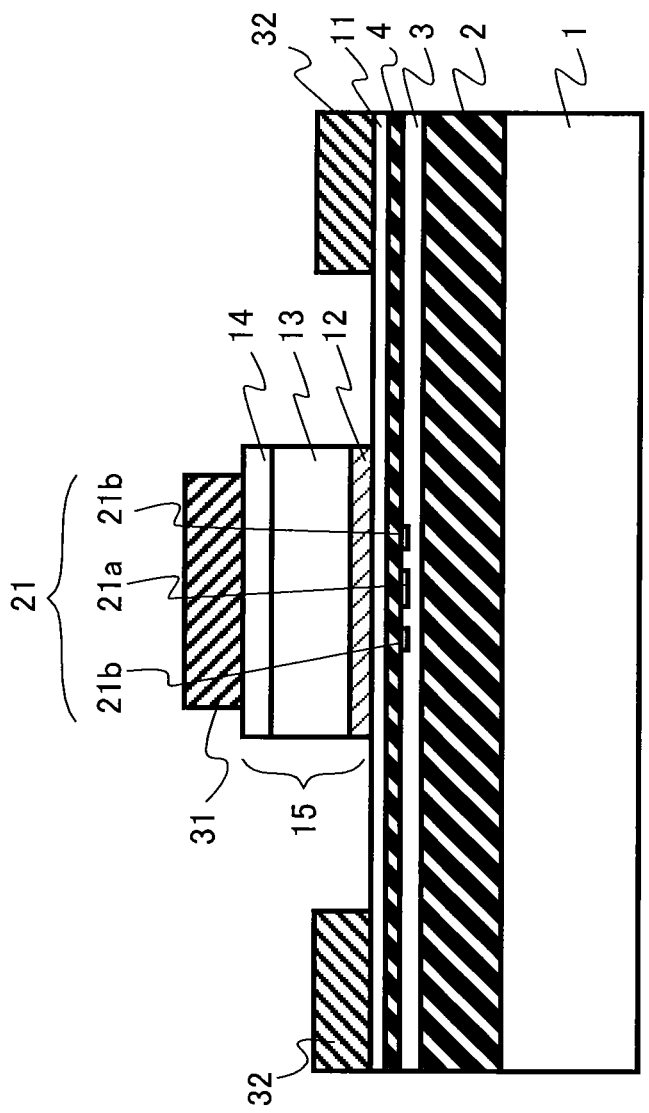
FIG. 9 is a schematic sectional view of a semiconductor laser device in a second embodiment.

FIG. 9 is a schematic sectional view of a semiconductor laser device in this embodiment. The semiconductor laser device in this embodiment is a III-V guiding type of Si hybrid DFB laser.

The Si hybrid DFB laser in this embodiment has the same basic structure and function as in the first embodiment. However, it differs in that a SiO$_2$ layer (insulating layer) 4 with a thickness equal to less than 100 nm, for example, 50 nm is formed between a Si layer (silicon layer) 3 and an n-InP cladding layer 11. An exemplary structure in this embodiment will be described below.

In fabricating the semiconductor laser device in this embodiment, thin SiO$_2$ layers are formed on respective surfaces of the n-InP layer 11 and the Si layer 3, and then both surfaces are flattened by means of CMP (chemical mechanical polishing), after which both SiO$_2$ layers are bonded to each other. With this fabrication process, the yield of the wafer bonding can be improved. However, if the insulating SiO$_2$ layer 4 having a low refractive index is present between an active layer 12 and a diffraction grating 21 formed on a surface of the Si layer 3, the overlapping between the diffraction grating 21 and the guided modes is deteriorated. In this case, the coupling coefficient of the diffraction grating 21 is prone to decrease.

In this embodiment, for example, the thickness of the Si layer 3 is set to as large as 400 nm whereby the spreading of light from the active layer 12 to the diffraction grating 21 is enhanced. Specifically, the mesa width $w_0$, the width $w_1$ of a main diffraction grating 21a and the width $w_2$ of each sub-diffraction grating 21b are set to 5 μm, 400 nm (=0.08$w_0$) and 250 nm (=0.05$w_0$=0.625 $w_1$), respectively. Other structures are substantially the same as in the first embodiment.

FIGS. 10A to 10C show TE modes in this embodiment. Three modes $TE_{00}$, $TE_{10}$ and $TE_{20}$ are present in the waveguide. The origin of the coordinate system is set to the center of the active layer 12, similar to the first embodiment. The center of the main diffraction grating 21a is positioned at X=0, Y=−0.42 μm; the centers of the sub-diffraction gratings 21b and 21b are positioned at X=±0.833 μm, Y=−0.42 μm. Specifically, the center of the main diffraction grating 21a corresponds to the node of the $TE_{10}$ mode; the centers of the sub-diffraction gratings 21b and 21b correspond to the nodes of the $TE_{20}$ mode.

Figure 11A:
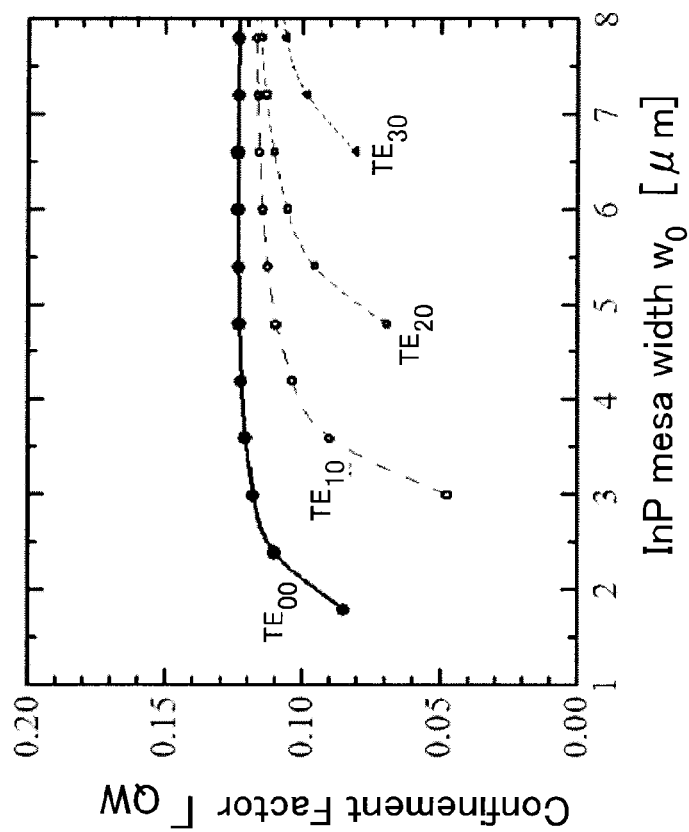
FIG. 11A shows a calculated result of the coupling coefficients κ for TE modes in the second embodiment.
Figure 11B:
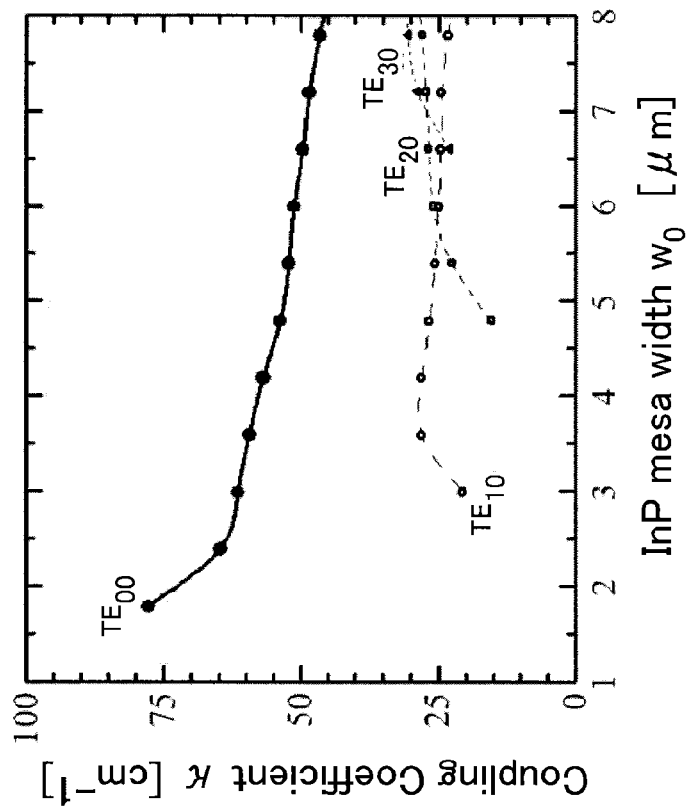
FIG. 11B shows a calculated result of the confinement factors $\Gamma_{QW}$ for the TE modes in the second embodiment.

Dependence of the coupling coefficient κ and the confinement factor $\Gamma_{QW}$ of the quantum well for TE modes on the mesa width in the Si hybrid DFB laser in this embodiment is calculated. The ratio $w_1/w_0$ of the width $w_1$ of the main diffraction grating 21a to the mesa width $w_0$ is set to a constant value, more specifically, 0.08. The ratio $w_2/w_0$ of the width $w_2$ of each sub-diffraction grating 21b to the mesa width $w_0$ is set to a constant value, more specifically, 0.05. FIG. 11A and FIG. 11B show the calculated results of the coupling coefficients κ and the confinement factors $\Gamma_{QW}$, respectively.

In this embodiment, since the increase in the thickness of the Si layer 3 decreases the number of guided modes, the mesa width can be increased to up to 6 μm or so. In this case, the confinement factor $\Gamma_{QW}$ in the fundamental mode is approximately 12%.

Since the DFB laser in this embodiment has an InP mesa with a width of as large as 5 μm, it needs a longer output taper structure than that in the first embodiment. According to an FDTD simulation of an exemplary output taper structure, approximately 80% of light from the Si hybrid DFB laser in this embodiment can be coupled to an output Si rib waveguide having a slab thickness of 200 nm, a mesa height of 200 nm and a mesa width of 600 nm under the condition of a total taper length being 54 μm, and approximately 90% under the condition of a total taper length being 69 μm.

If the thickness of the SiO$_2$ layer 4 further increases, the thickness of the Si layer 3 can also be further increased, in which case the decrease in the confinement factor $\Gamma_{QW}$ can be prevented to some extent. For example, when the SiO$_2$ layer 4 is 75 nm thick, if the thickness of the Si layer 3 is set to 425 nm, the confinement factor $\Gamma_{QW}$ for the fundamental mode becomes approximately 10%.

When the width $w_1$ of the main diffraction grating 21a is 0.08 $w_0$ and the width $w_2$ of each sub-diffraction grating 21b is 0.05$w_0$ (=0.625 $w_1$), the coupling coefficients κ for the higher-order modes are about half as high as that for the fundamental mode over the mesa width $w_0$ range of up to 7.2 μm. Specifically, the coupling coefficient κ for the fundamental mode becomes 56 cm$^{-1}$ under the condition of mesa width being 4.8 μm, and 50 cm$^{K1}$ under the condition of mesa width being 7.2 μm. It should be noted that if a SiO$_2$ layer has a thickness more than 100 nm, it becomes difficult to apply this embodiment, because when a Si layer is 450 nm thick, light in the fundamental mode can no longer be confined in a III-V mesa.

According to the semiconductor laser device described above, application of a diffraction grating 21 including a main diffraction grating 21a and sub-diffraction gratings 21b and 21b formed on both sides of the main diffraction grating 21a makes it possible to provide a semiconductor laser device that has good temperature characteristics, similar to the first embodiment. It is also possible to provide a semiconductor laser device that has a high efficiency and good mode stability.

This embodiment may be modified and applied in various ways as needed.

If a mesa width increases as in this embodiment, for example, parts of a p-InGaAs contact layer 14 which are on both sides of a III-V mesa may be removed so that a p-electrode 31 directly makes contact with the surface of the p-InP cladding layer 13. Most of current flows through the contact part between the p-InGaAs layer 14 and the p-electrode 31 in which a contact resistance is low. In contrast, a part of heat generated in the active layer 12 or the p-InP cladding layer 13 dissipated directly from the p-InP cladding layer 13 to the p-electrode 31 without passing across the p-InGaAs contact layer 14 having a low thermal conductivity. In this way, the heat resistance of the mesa can be decreased. By widening the mesa, sufficiently wide contact areas between the p-electrode 31 and the p-InGaAs contact layer 14 and between the p-electrode 31 and the p-InP cladding layer 13 can be reserved.

Third Embodiment

A semiconductor laser device in a third embodiment differs from that in the first embodiment in that a Si layer has a second mesa structure and a first mesa structure in a compound semiconductor layer is partially semi-insulated. Hereinafter, the same parts as in the first embodiment will not be described.

Figure 12:
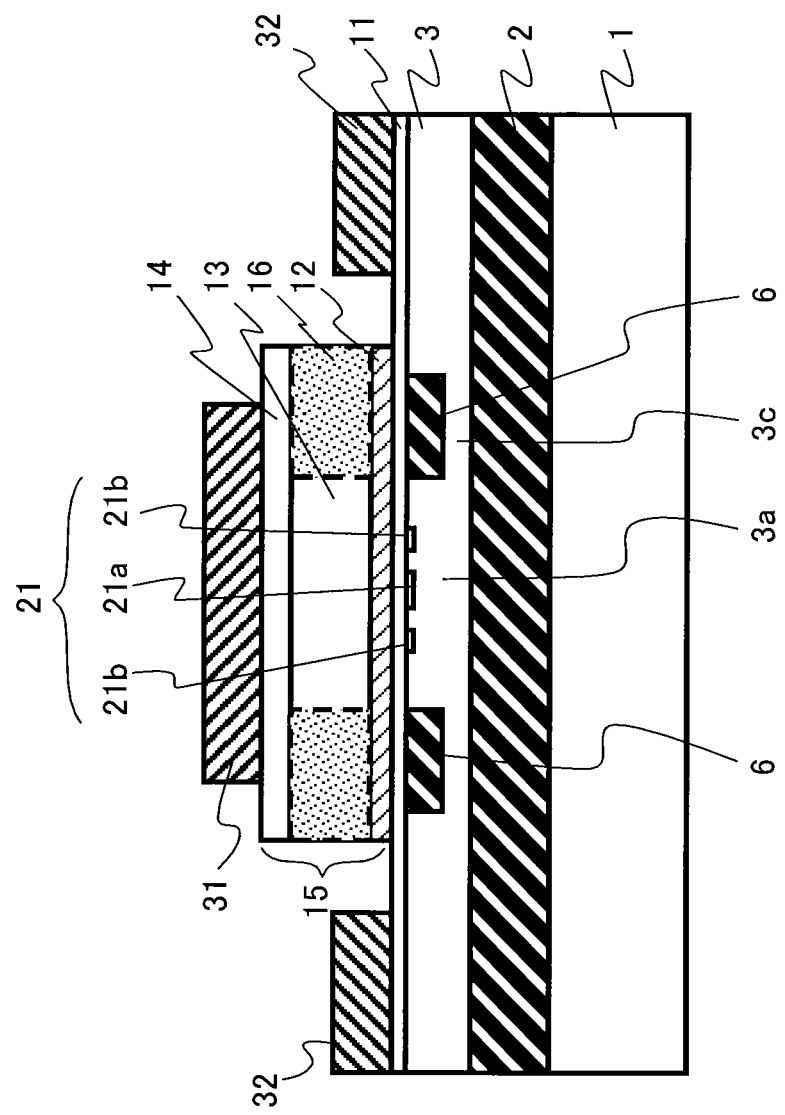
FIG. 12 is a schematic sectional view of a semiconductor laser device in a third embodiment.

FIG. 12 is a schematic sectional view of a semiconductor laser device in this embodiment. The semiconductor laser device in this embodiment is a Si guiding type of Si hybrid DFB laser. An exemplary structure in this embodiment will be described below.

A III-V epitaxial growth layer (compound semiconductor layer) is bonded to a surface of an SOI substrate. Specifically, the SOI substrate includes a Si substrate 1, an embedded SiO$_2$ (BOX) layer 2 with a thickness of 1 µm, and a top Si layer (silicon layer) 3 with a thickness of 400 nm. The III-V epitaxial growth layer includes an n-InP layer 11 with a thickness of 225 nm, an active layer 12 with a thickness of 300 nm, a p-InP cladding layer 13 with a thickness of 950 nm and a p-InGaAs contact layer 14 with a thickness of 200 nm. The structures of the III-V compound semiconductor layers 11 to 14 are substantially the same as in the first embodiment.

A Si rib waveguide (second mesa structure) 3a with a width $w_0$ of 4.2 µm is formed in the Si layer 3 by etching both sides of the Si layer 3 by a depth of 200 nm and a width of 2.5 µm and embedding SiO$_2$ 6 and 6 in the etched parts. The thinner portions 3c and 3c of the Si layer 3 under the SiO$_2$ 6 serve as a slab layer of the Si rib waveguide 3a.

The active layer 12, the p-InP cladding layer 13 and the p-InGaAs contact layer 14 in the III-V epitaxial growth layer are processed so as to constitute a mesa (first mesa structure) 15 with a width of 14 µm such that its center is substantially aligned with the center of the Si rib waveguide (second mesa structure) 3a.

Semi-insulating regions 16 are formed in the p-InP cladding layer 13 above the external regions of the Si rib waveguide 3a by means of proton ion implantation and annealing. A p-electrode 31 is formed over a mesa 15; n-electrodes 32 and 32 are also formed on the n-InP layer 11 at some distance from the mesa 15. Through the electrodes 31 and 32, current is injected into a part of the active layer 12 which faces the Si rib waveguide 3a, causing a laser oscillation.

A set of diffraction gratings 21 is formed on a surface of the Si rib waveguide 3a: A Si/SiO$_2$ main diffraction grating 21a is formed along the center line of the Si rib waveguide 3a, whereas Si/SiO$_2$ sub-diffraction gratings 21b and 21b are formed along the lines which divide the width of the Si rib waveguide 3a into three equal parts. In other words, the main diffraction grating 21a is disposed at the central point of the second mesa structure 3a, whereas the sub-diffraction gratings 21b and 21b are disposed at respective points at which the second mesa structure is divided into three equal parts.

A width $w_1$ of the main diffraction grating 21a is set to $0.015w_0=63$ nm, whereas a width $w_2$ of each sub-diffraction grating 21b is set to $0.012w_0=50.4$ nm. The length of a resonator (diffraction grating) is set to 200 µm; a λ/4 phase shifter 22 is formed at the center of the resonator.

FIGS. 13A to 13D show TE modes in this embodiment. The active layer 12 and the Si rib waveguide 3a are optically coupled to form an optical waveguide. As illustrated in FIGS. 13A to 13D, four TE modes are present in this optical waveguide.

Among them, the TE$_{30}$ mode suffers a large loss, because it extends to the portions under the proton-implanted region 16 in the active layer 12. The other TE modes peak within the Si rib waveguide 3a. The center (X=0 µm) of the main diffraction grating 21a corresponds to the node of the TE$_{10}$ mode; the centers (X=±0.7 µm) of the sub-diffraction gratings 21b and 21b correspond to the respective nodes of the TE$_{20}$ mode.

As a result of the above, the coupling coefficient κ for the TE$_{00}$ mode is 62.9 cm$^{-1}$. However, the coupling coefficients κ for the TE$_{10}$, TE$_{20}$ and TE$_{30}$ modes are reduced to 28.7, 32.1 and 21.8 cm$^{-1}$, which correspond to 46, 51 and 35%, respectively, of the coupling coefficients κ for the fundamental mode. The product κL for the fundamental mode is 1.258, which means that axial hole burning is suppressed to a substantial minimum.

Figure 14A:
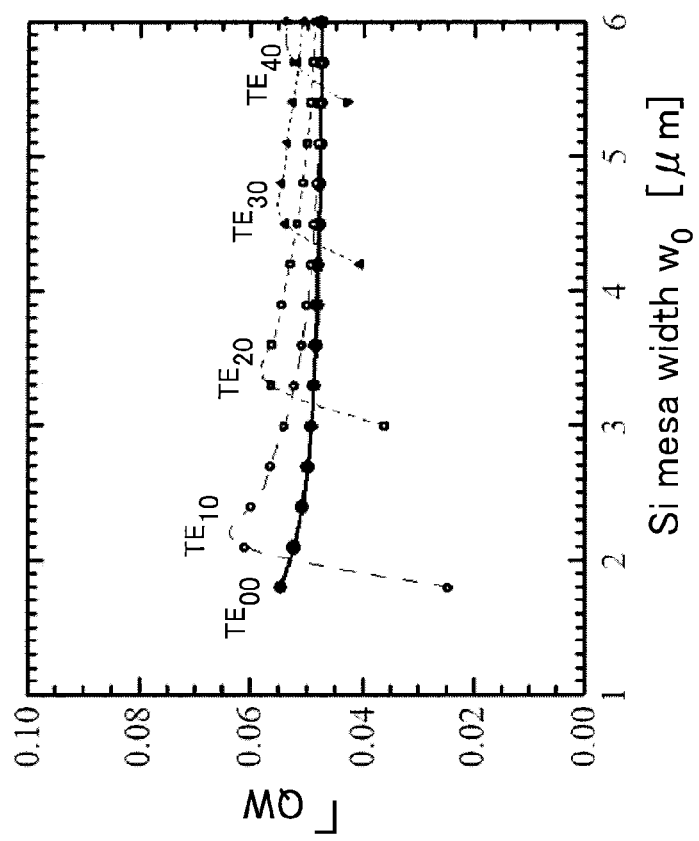
FIG. 14A shows a calculated result of the coupling coefficients κ for TE modes in the third embodiment.
Figure 14B:
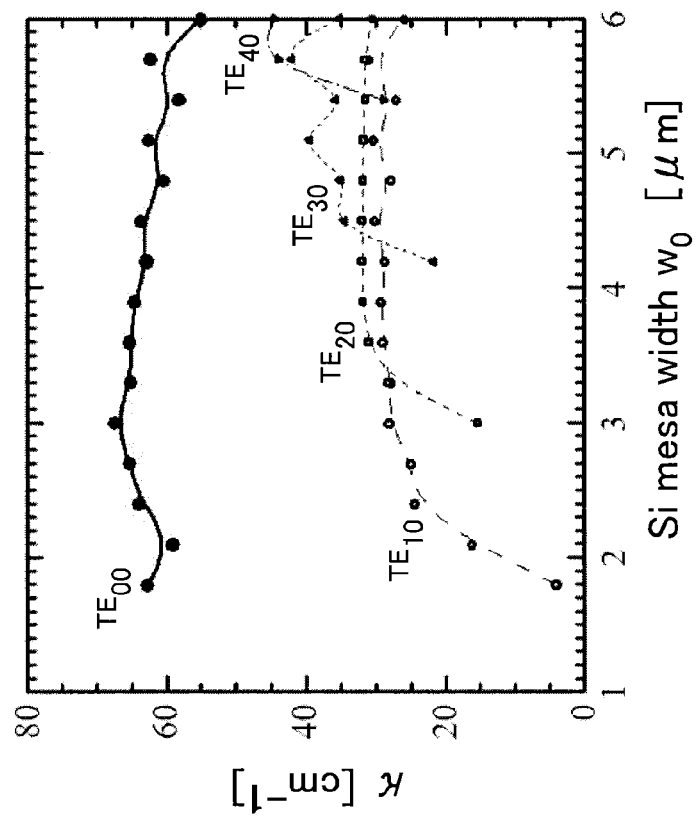
FIG. 14B shows a calculated result of the confinement factors $\Gamma_{QW}$ for the TE modes in the third embodiment.

FIG. 14A and FIG. 14B show calculated results of the coupling coefficients κ and the confinement factors $\Gamma_{QW}$, respectively, for the TE modes in this embodiment, when the width $w_0$ of the Si rib waveguide in the Si hybrid DFB LD in this embodiment is varied. In this case, the confinement factor $\Gamma_{QW}$ is defined as the ratio of power in a portion of the quantum well which has a width $w_0$ and faces Si rib waveguide 3a.

The ratio of the width $w_1$ of the main diffraction grating 21a to the mesa width (second mesa structure width) $w_0$ is set to a constant value, more specifically, 0.015; the ratio of the width $w_2$ of each sub-diffraction grating 21b to the mesa width (second mesa structure width) $w_0$ is set to a constant value, more specifically, 0.012. The dispersion in the calculated coupling coefficient κ is due to a calculation error, because a calculation mesh for an electrical field distribution is not sufficiently fine in size in comparison to the width of a diffraction grating 21.

Within the $w_0$ range of up to 4.2 µm, at which the coupling coefficient κ for the TE$_{30}$ mode starts increasing, the coupling coefficients κ for all the higher-order modes are reduced to half or less than that for the fundamental (TE$_{00}$) mode. The confinement factor $\Gamma_{QW}$ for the fundamental mode is approximately 5%. The peaks of the outermost antinodes of the highest-order mode lie in the active layer 12, like the TE$_{30}$ mode shown in FIG. 13D, whereas the peaks of the other modes lie in the Si rib waveguide 3a. Therefore, the highest-order mode has the largest confinement factor $\Gamma_{QW}$ unless it is a leaky mode.

Figure 15:
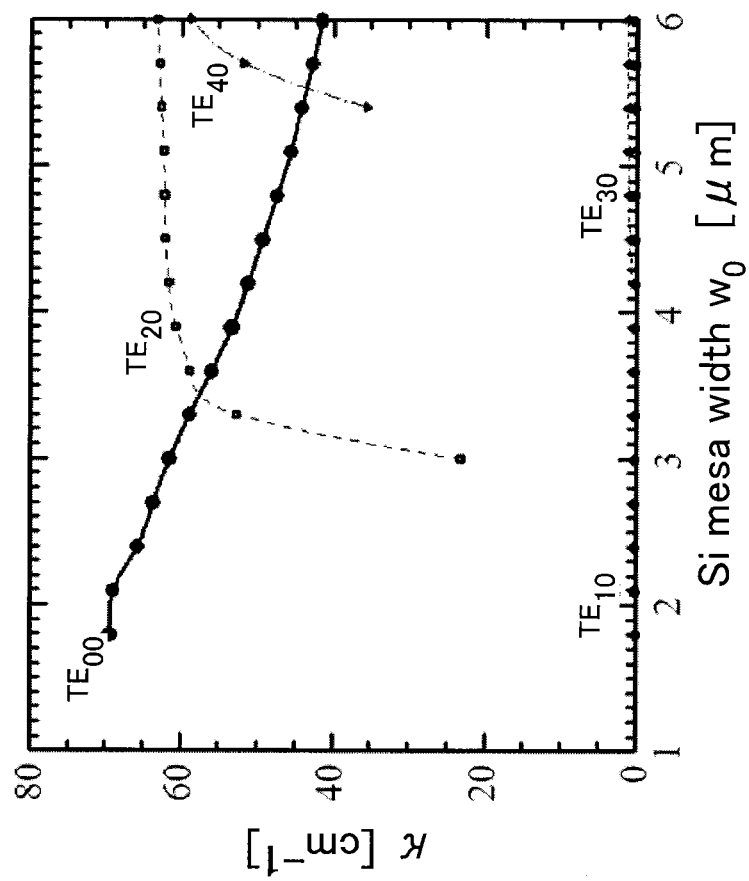
FIG. 15 shows a calculated result of the coupling coefficients κ for the TE modes in a comparative embodiment.

FIG. 15 shows a calculated result of the coupling coefficients κ for the TE modes in a comparative embodiment. More specifically, this drawing shows the calculated result of the dependence of the coupling coefficients κ of a comparative laser for the TE modes on a mesa width. Here, the comparative laser is provided with a single diffraction grating whose width is set to 4% of the mesa width is formed at the center of a Si rib waveguide 3a. When the mesa width exceeds 3 µm, the coupling coefficient κ for the TE$_{20}$ mode rapidly increases, and exceeds that for the fundamental mode within the mesa width range of 3.5 µm or over.

Since the TE$_{20}$ mode exhibits the largest confinement factor $\Gamma_{QW}$ within the above range, the laser is likely to oscillate in the TE$_{20}$ mode unless the propagation loss for the TE$_{20}$ mode is sufficiently greater than that for the fundamental mode.

According to the third embodiment, therefore, the range of the mesa width over which a laser oscillates in a fundamental transverse mode can be expanded to approximately 1.4 times that when a single diffraction grating is formed.

From the viewpoint of setting the coupling coefficient κ for each TE mode and the product κL of the coupling coefficient κ of the diffraction grating 21 and the resonator length L to appropriate values so that a good single mode oscillation is achieved, the width $w_1$ of the main diffraction grating 21a is desirably set to 10% or less of the width of the second mesa structure 3a. Furthermore, the width $w_2$ of each sub-diffraction grating 21b is desirably set to smaller than the width $w_1$ of the main diffraction grating 21a and larger than half the width of the main diffraction grating 21a.

The increase in the Si rib waveguide 3a can: relatively reduce the influence of a scattering loss that would be caused due to the surface roughness of the mesa wall; increase a tolerance for the relative position between a III-V epitaxial growth layer and an SOI substrate; achieve greater power with the same resonator length (or the same power with a shorter resonator length); and the like. These features are the same as those of the first and second embodiments.

For a Si guiding type of Si hybrid laser, even if the mesa in a Si rib waveguide is widened, the effect of improving the thermal resistance is not prominently enhanced. This is because heat generated by the laser can be dissipated from the active region through a proton-implanted region, and therefore the thermal resistance is basically lower than a III-V guiding type of Si hybrid laser. If a wider Si mesa (second mesa structure) is used, however, the thickness of a Si layer 3 can be reduced, and therefore the integration density can be improved.

Figure 16A:
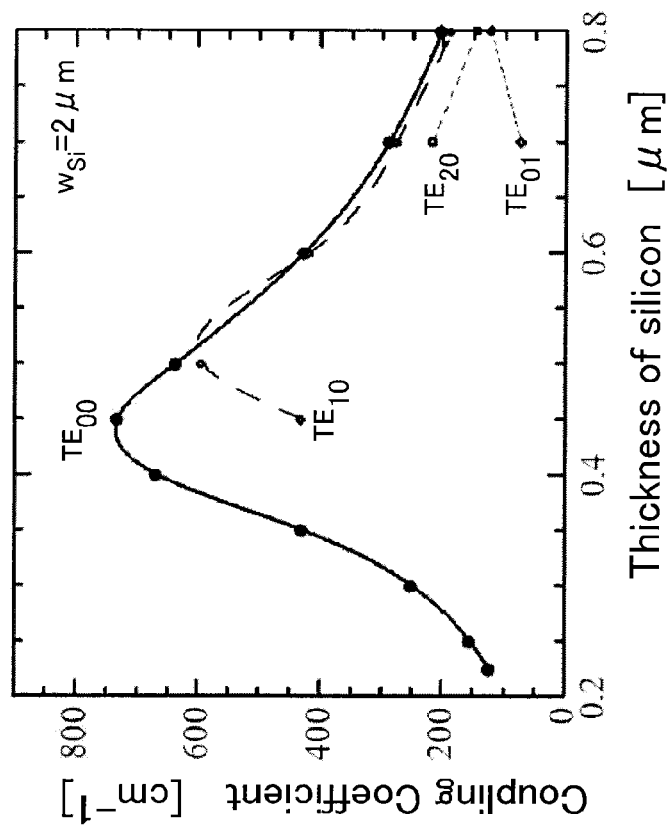
FIG. 16A shows dependence of the confinement factors $\Gamma_{QW}$ for TE modes on the thickness of a Si waveguide layer.
Figure 16B:
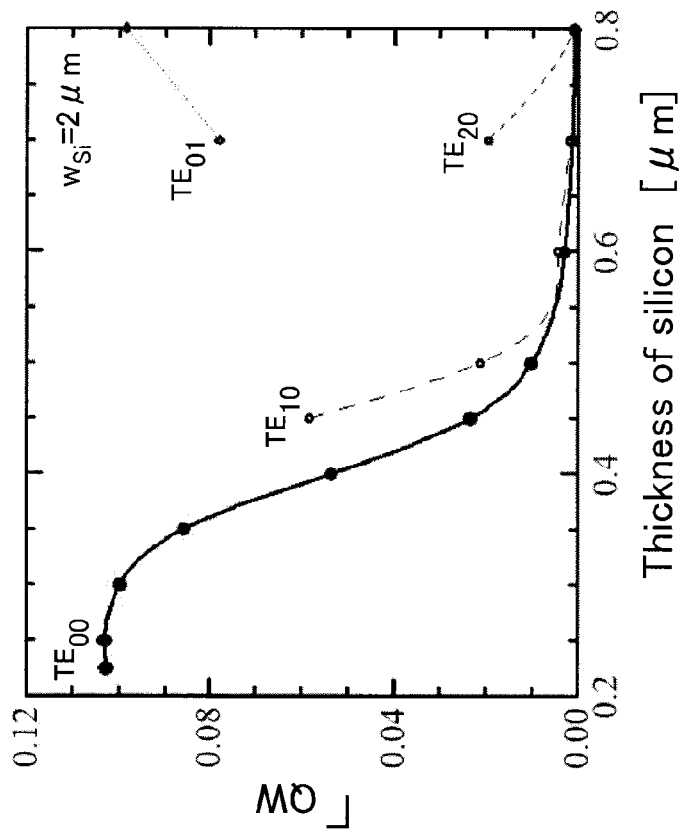
FIG. 16B shows dependence of the coupling coefficients κ for the TE modes on the thickness of the Si waveguide layer.

FIG. 16A shows a calculated result of the dependence of the confinement factors $\Gamma_{QW}$ for the TE modes on the thickness of a Si waveguide layer; FIG. 16B shows a calculated result of the dependence of the coupling coefficients κ for TE modes on the thickness of a Si waveguide layer.

The calculated results are obtained from a Si guiding type Si hybrid laser formed under the condition of a proton un-implanted region being 4 μm in width, a Si mesa being 2 μm in width, a diffraction grating being as wide as the Si mesa, and the thickness of the Si waveguide layer 3 being the variable.

It is assumed that the thickness of a Si slab layer 3b is half as large as that of the Si layer 3. When the thickness of the Si layer is decreased to 500 nm or less, the confinement factor $\Gamma_{QW}$ for the fundamental mode rapidly increases. Therefore, even a slight decrease in the Si layer contributes to a large increase in the confinement factors $\Gamma_{QW}$ for the fundamental mode, thereby improving the slope efficiency. However, the thickness of the Si layer 3 is desirably set to 400 nm or more. A reason is that when the thickness of the Si layer 3 is excessively decreased, the center of the mode profile shifts toward the active layer 12 and expands to the unexcited region under the proton-implanted region 16. Within this range (400 to 500 nm), however, the coupling coefficient κ is extremely large (600 to 750 $cm^{-1}$). Therefore, the coupling coefficient κ is desirably adjusted to an appropriate value by narrowing the diffraction grating.

Generally, the coupling coefficient κ of a Si guiding type of Si hybrid laser tends to be excessively large, because light is concentrated in a Si waveguide having a diffraction grating formed thereon. In addition, since the confinement factor $\Gamma_{QW}$ is relatively low, it is necessary to increase the resonator length L in order to ensure a sufficient output. Thus, the optimum coupling coefficient κ for Si guiding types of Si hybrid lasers is smaller than that of III-V guiding types of Si hybrid lasers. It is, however, difficult to decrease the coupling coefficient κ by at least one order by adjusting only the depth of a diffraction grating and a duty ratio, in terms of the controllability, uniformity, and reproducibility of the diffraction grating. The simplest way is to narrow the diffraction grating, but when the Si rib waveguide has a narrow width, the lateral width of the diffraction grating needs to be equal to or smaller than the width of each groove in the diffraction grating in order to adjust the coupling coefficient κ to a desired value. This decreases a tolerance for fabrication processing. According to a semiconductor laser device in this embodiment, the width of the Si rib waveguide is increased, whereas the resonator length L is shortened. Therefore, the coupling coefficient κ can be adjusted to a desired value with a wider diffraction grating, which expands the process margin.

According to a semiconductor laser device in this embodiment, application of a diffraction grating 21 including a main diffraction grating 21a and sub-diffraction gratings 21b and 21b formed on both sides of the main diffraction grating 21a makes it possible to provide a semiconductor laser device that has good temperature characteristics, similar to the first embodiment. It is also possible to provide a semiconductor laser device that has a high efficiency and good mode stability.

Fourth Embodiment

A semiconductor laser device in a fourth embodiment differs from that in the third embodiment in that an insulating layer with a thickness equal to or less than 100 nm is further formed between a compound semiconductor layer and a silicon layer. Hereinafter, the same parts as in the third embodiment will not be described.

Figure 17:
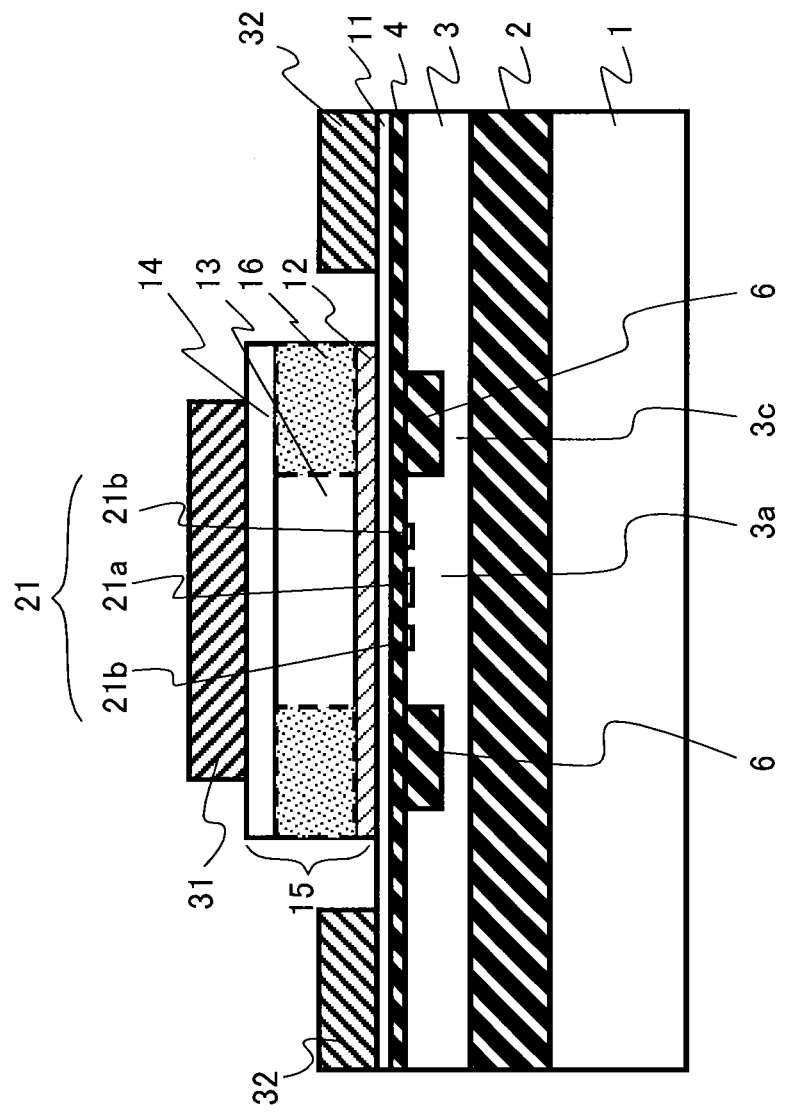
FIG. 17 is a schematic sectional view of a semiconductor laser device in a fourth embodiment.

FIG. 17 is a schematic sectional view of a semiconductor laser device in this embodiment. The semiconductor laser device in this embodiment is a Si guiding type Si hybrid DFB laser.

The Si hybrid DFB laser in this embodiment has the same basic structure as in the third embodiment, but differs in that a $SiO_2$ layer (insulating layer) 4 with a thickness equal to or less than 100 nm, for example, 50 nm is formed between a Si layer 3 and an n-InP layer 11. An exemplary structure in this embodiment will be described below.

In order to avoid the reduction in the overlapping between guided modes and a diffraction grating which would be caused due to the insertion of the $SiO_2$ layer 4, the Si layer 3 in this embodiment is set to 425 nm, which is thicker than that in the third embodiment.

The mesa height of a Si rib waveguide 3a and the thickness of Si slabs 3b and 3b on both sides of the Si rib waveguide 3a are set to 212.5 nm. The width $w_1$ of a main diffraction grating 21a and the width $w_2$ of each sub-diffraction grating 21b are set to $0.065w_0$ and $0.04w_0$, respectively. As opposed to the first to third embodiments, however, the respective center lines of the sub-diffraction grating 21b, the main diffraction grating 21a and the sub-diffraction grating 21b are set at regions where a Si mesa (second mesa structure) is divided laterally at the ratio of 3:2:2:3. A reason is that since a $TE_{20}$ mode trails toward the parts of an active layer 12 under a proton-implanted region 16, the nodes of the $TE_{20}$ mode are displaced outward at the regions where the mesa is divided into three equal parts.

Figure 18A:
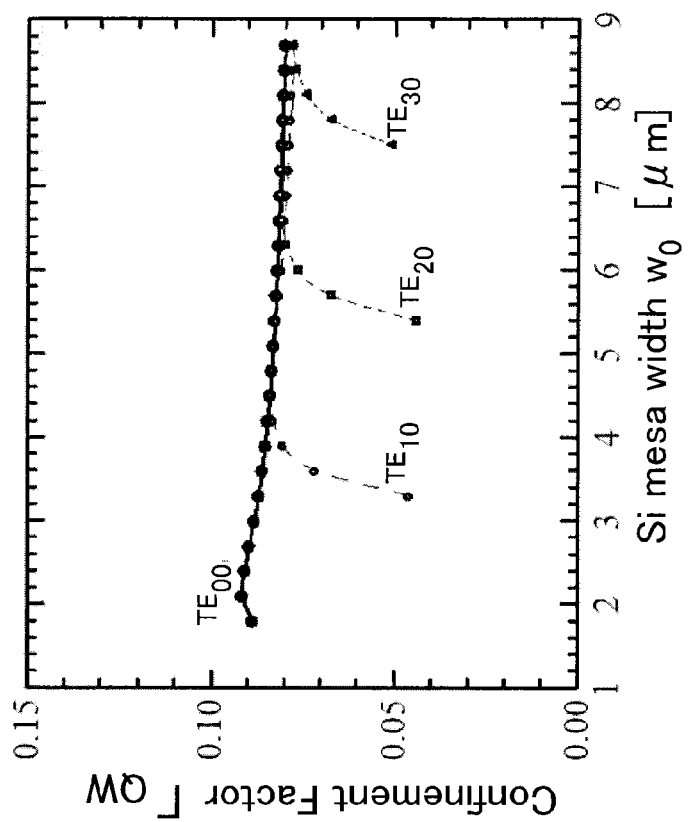
FIG. 18A shows a calculated result of the coupling coefficients κ for TE modes in the fourth embodiment.
Figure 18B:
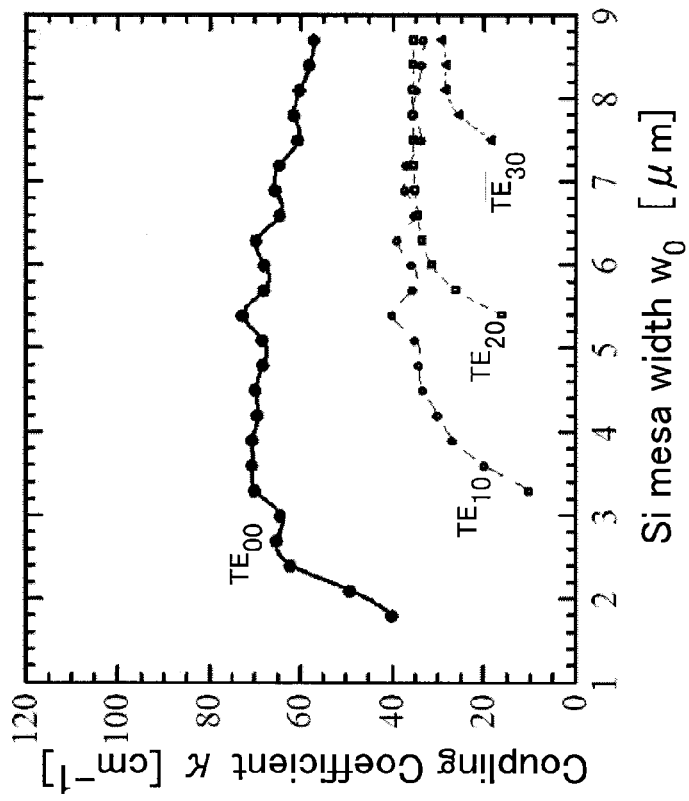
FIG. 18B shows a calculated result of the confinement factors $\Gamma_{QW}$ for the TE modes in the fourth embodiment.

FIGS. 18A and 18B show calculated results of the coupling coefficients κ and the confinement factors $\Gamma_{QW}$, respectively, for TE modes in this embodiment.

Within the Si mesa (second mesa structure) width range of up to 8.1 μm, the coupling coefficients κ for the higher-order modes are reduced to 60% or less of that (60 to 70 $cm^{-1}$) for the fundamental mode. In this case, the confinement factors $\Gamma_{QW}$ and the coupling coefficients κ for the fundamental mode are 8% or more and 60 to 70 $cm^{-1}$, respectively and thus fall within proper ranges.

Figure 19A:
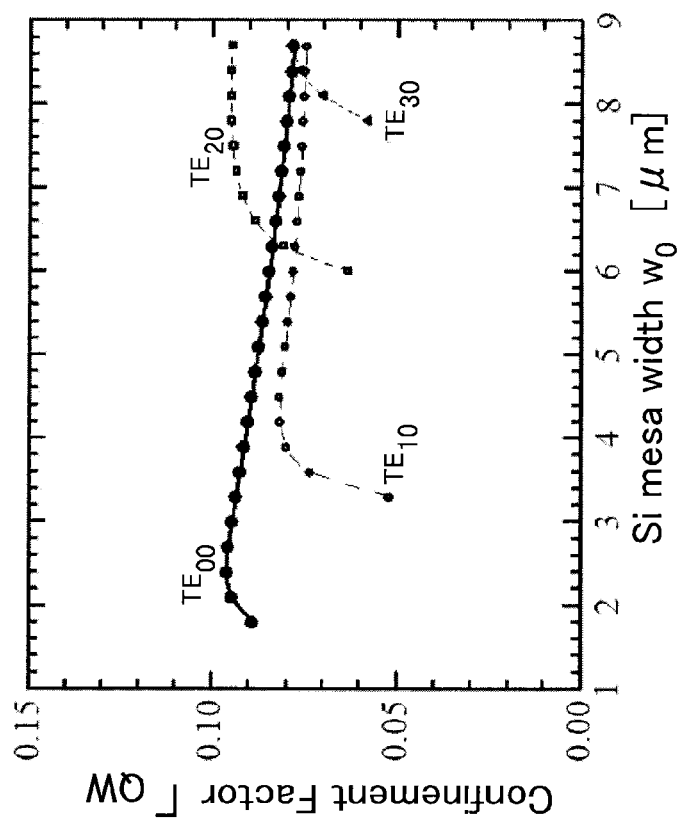
FIGS. 19A and 19B show calculated results of the coupling coefficients κ and confinement factors $\Gamma_{QW}$, respectively, for TE modes in a comparative embodiment.
Figure 19B:
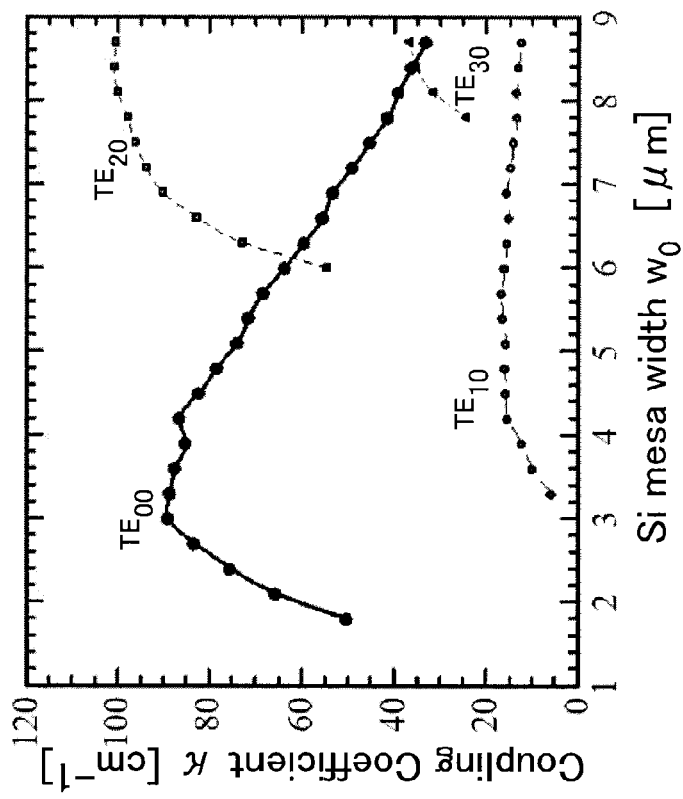

For comparison, the coupling coefficients κ and confinement factors $\Gamma_{QW}$ are calculated when a single diffraction grating with a width w of $0.25w_0$ is formed at the center of a mesa. FIGS. 19A and 19B show calculated results of the coupling coefficients κ and confinement factors $\Gamma_{QW}$, respectively, for TE modes in this comparative embodiment.

As the Si mesa width increases, field distribution in the diffraction grating is remarkably reduced, and the coupling coefficient κ for the fundamental mode is decreased. Furthermore, there is a large difference in the confinement factor $\Gamma_{QW}$ between when a diffraction grating is not divided and when it is divided into three parts, because the shapes of the modes are sensitive to the cross section of the diffraction grating. The mesa width is desirably set to 5.7 μm or less in order to avoid the mode competition between the fundamental mode and the $TE_{20}$ mode.

According to the forth embodiment, a mesa can be widened to 1.4 times that when a diffraction grating is not divided into multiple parts. The effect of widening the mesa is the same as in the third embodiment.

According to a semiconductor laser device in this embodiment, adoption of a diffraction grating 21 including a main diffraction grating 21a and sub-diffraction gratings 21b and 21b formed on both sides of the main diffraction grating 21a makes it possible to provide a semiconductor laser device that has good temperature characteristics, similar to the third embodiment. It is also possible to provide a semiconductor laser device that has a high efficiency and good mode stability.

Fifth Embodiment

A semiconductor laser device in the fifth embodiment differs from those in the first to fourth embodiments, because the semiconductor laser devices in the first to fourth embodiments are interband light-emitting semiconductor lasers in which an active layer is sandwiched between n-type and p-type semiconductor layers, whereas the semiconductor laser device in the fifth embodiment is a quantum cascade laser (QCL) that emits light by means of intersubband transition.

Figure 20:
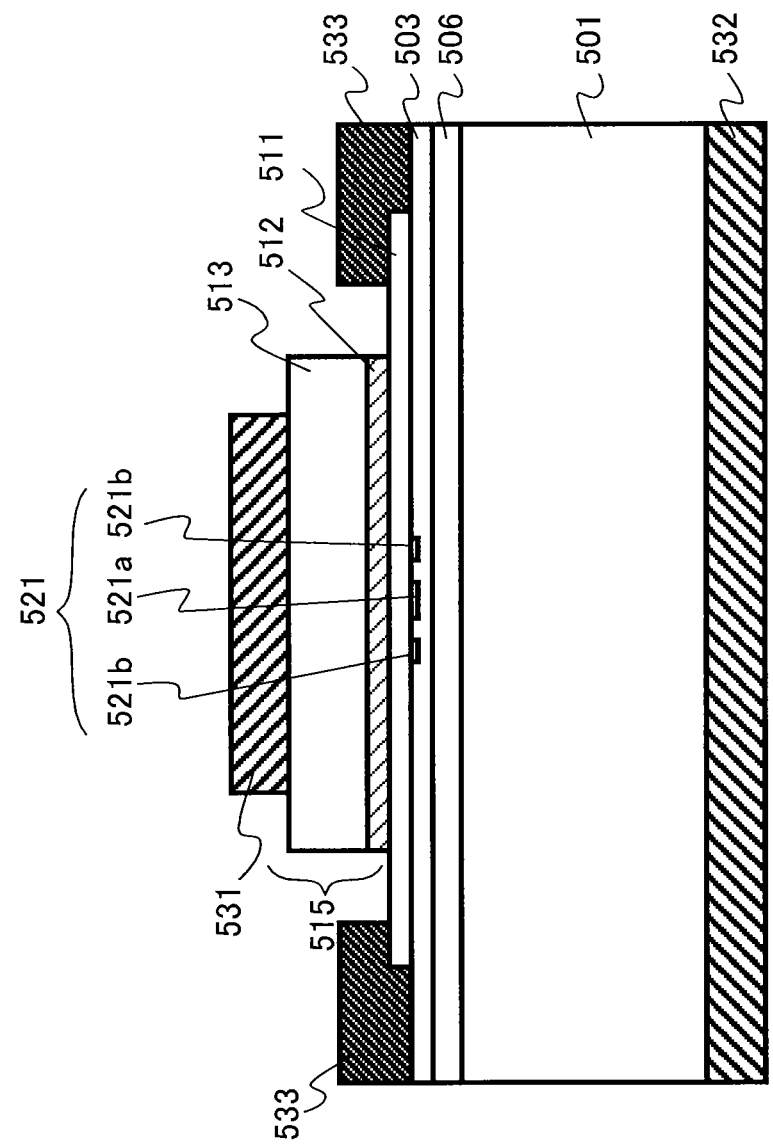
FIG. 20 is a schematic sectional view of a semiconductor laser device in a fifth embodiment.

FIG. 20 is a schematic sectional view of a semiconductor laser device in this embodiment. The semiconductor laser device in this embodiment is a Si hybrid DFB-QCL that emits light of a wavelength in an 8 μm band, the cross section being in a direction perpendicular to an extending direction of a resonator.

In FIG. 20, the structure is illustrated while being deformed in order to facilitate the explanation, and its size accordingly differs from a real one. Because of laser light with a long wavelength, the thicknesses of individual layers are several times as large as those in the first to fourth embodiments. An exemplary resonator length is 3 mm.

The Si hybrid DFB-QCL in this embodiment is fabricated through the following processing. An InP substrate-based compound semiconductor epitaxial layer is bonded directly to a processed surface of a Si substrate by means of a wafer bonding technique. Then, the thickness of the InP substrate is decreased, and a mesa is formed thereof, after which insulating films, electrodes, metal wires and the like are formed thereon. For the sake of simplicity of the explanation, the insulating films and metal wires are not illustrated in the drawing. Furthermore, a sub-mount, a cooling mechanism, modules and the like that are arranged outside the chip will not be described either. An exemplary structure in this embodiment will be described below.

A high-concentration n-type Si layer 506 with a carrier concentration of $10^{19}$ to $10^{20}$ $cm^{-3}$ is formed in an n-type Si substrate 501 at a depth of approximately 1 μm from its surface by means of an ion implantation and annealing. An n-type Si optical waveguide layer (silicon layer) 503 is left over the high-concentration n-type Si layer 506. A stack-structured compound semiconductor layer that includes an n-InP layer 511, an InGaAs/AlGaAs superlattice layer 512 and an n-InP layer 513 are bonded to the n-type Si layer 503 and processed into a mesa shape. The n-InP layer 513 is doped so that its upper part has a higher carrier density.

An electrode 531 is formed over the mesa (first mesa structure); an electrode 532 is formed on the rear surface of the n-type Si substrate 501. Since an electrical barrier is left at the interface between the n-InP layer 511 and the n-type Si layer 503, the n-InP layer 511 extends from the right and left sides of a mesa 515, and auxiliary electrodes 533 and 533 electrically connected to the electrode 532 are formed over the respective extending parts.

When electrons are injected from the electrode 531, they move through the n-InP layer 513, the superlattice layer 512 and the n-InP layer 511 in this order. Then, some of the electrons are output from the electrode 532 through the n-type Si layer 503, the high-concentration n-type Si layer 506 and the n-type Si substrate 501; the others are output from the right auxiliary electrode 533 and the left auxiliary electrode 533 through the n-InP layer 511. Alternatively, the Si hybrid DFB-QCL in this embodiment may be designed such that electrons move in the opposite direction.

Two-phonon absorption in a Si layer causes a large loss for light with a wavelength of 9 μm or longer, but the absorption is weak in an 8 μm wavelength band. Light is primarily confined in a lateral direction by the mesa structure and in a vertical direction by a carrier plasma effect. The decrease in the refractive index due to the carrier plasma effect is nearly proportional to the square of a wavelength. Therefore, the difference in refractive indexes of the n-type Si layer 503 and the high-concentration n-type Si layer 506 can be set to a relatively large value. For this reason, a thick $SiO_2$ (BOX) layer is not necessary between a substrate and an optical waveguide, as opposed to the first to fourth embodiments.

A main diffraction grating 521a and sub-diffraction gratings 521b and 521b are formed on a surface of the n-type Si optical waveguide layer 503. More specifically, the main diffraction grating 521a is disposed under the center of the mesa 515; the sub-diffraction gratings 521b and 521b are disposed at regions where the mesa 515 is divided into three equal parts. $SiO_2$ is embedded in the grooves of a diffraction grating 521. In a typical DFB-QCL, diffraction grating is formed on an upper surface or side walls of the mesa. In contrast, the Si hybrid DFB-QCL in this embodiment has a diffraction grating embedded in a waveguide thereof.

The Si hybrid FFB-QCL in this embodiment produces the same effect as the Si hybrid DFB lasers in the first to fourth embodiments, more specifically, can oscillate at a single transverse mode even if the mesa is widened. Conventional DFB-QCLs that emit light in an 8 μm wavelength band typically have a mesa with a width of 30 μm or less. In contrast, the mesa in the DFB-QCL in this embodiment can be widened to up to 40 μm or so.

A typical operating principal of a quantum cascade laser (QCL) will be described below. The superlattice layer 512 includes injector layers and active layers that are stacked over several tens of periods; the injector layers and active layers being each made of a superlattice. Since donor impurities are modulation-doped into a portion of the injector layers, electrons are present in the superlattice layer 512.

The superlattice layer 512 is designed such that when a preset voltage is applied, the energy level of the lower subband in an active layer at an upstream stage aligns with that of the upper subband in the injector layer at the next stage and the energy level of the lower subband in this injector layer aligns with that of the upper subband in the next active layer. In addition, the superlattice layer 512 is designed such that a miniband is formed in each injector layer and an electron in the upper energy level in each injector layer immediately relaxes to the lower energy level by emitting a LO phonon. As a result, when an electron in an active layer at an upstream stage falls from the upper energy level to the lower energy level due to the stimulated emission, it is immediately transferred to the upper energy level of the active layer at the next stage across the injector layer. With this mechanism, each active layer undergoes a population inversion, and therefore the active layer at each stage obtains a stimulated emission gain. Laser oscillation is achieved when an appropriate resonator structure is combined with this gain mechanism.

In addition to the above structure, various modifications are possible, such as a structure in which instead of a miniband, each injector layer has three subbands, the respective differences between the energy levels of which are identical to the corresponding LO phonon energy and a structure in which the upper and lower energy levels of each active layer are slightly spatially offset from one another. This embodiment is applicable to various DFB-QCLs, regardless of superlattice structure and wavelength.

In any case, the energy of LO phonons emitted in injector layers is finally converted into heat. QCLs that emit a large amount of LO phonons are typically cooled in use. Even for QCLs that oscillate at ambient temperatures, thermal designs are very important.

Refractive index of an active layer can be varied by changing temperature of a heatsink. By utilizing this property, the oscillation wavelengths of DFB-QCLs can be tuned.

With a Si/InP hybrid DFB-QCL in this embodiment, the mesa can be widened. It is thus possible to decrease a thermal resistance of a surrounding area of an active layer and increase an output power. Moreover, the thermal conductivity of a Si substrate is 148 W/m/K, whereas the thermal conductivity of an InP substrate is 80 W/m/K. This means that it is possible to decrease 40% or more of the thermal resistance of a substrate. Thus DFB-QCLs can be operated with higher current at higher temperatures, and its output power range and tunable wavelength range can be extended.

According to a semiconductor laser device in this embodiment, application of a diffraction grating 21 including a main diffraction grating 21a and sub-diffraction gratings 21b and 21b formed on both sides of the main diffraction grating 21a makes it possible to provide a semiconductor laser device that has good temperature characteristics, similar to the first to fourth embodiments. It is also possible to provide a semiconductor laser device that has a high efficiency and good mode stability.

This embodiment can be modified and applied in various ways as needed. For example, the material of a semiconductor laser device in this embodiment is not limited InP-based InGaAs/InAlAs. Alternately, it may be GaAs/AlGaAs, InGaAsSb/AlGaAsSb or some other materials.

While certain embodiments have been described, these embodiments have been presented by way of example only, and are not intended to limit the scope of the inventions. Indeed, a semiconductor laser device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor laser device comprising:
   a compound semiconductor layer including an active layer emitting laser light, the compound semiconductor layer having a first mesa structure; and
   a silicon layer bonded with the compound semiconductor layer, a diffraction grating being provided on a surface of the silicon layer facing the compound semiconductor layer, the diffraction grating including a main diffraction grating and two sub-diffraction gratings, the main diffraction grating extending in a longitudinal direction of the first mesa structure, the sub-diffraction gratings being disposed on both sides of the main diffraction grating,
   wherein
   each of the main diffraction grating and the two sub-diffraction gratings is entirely disposed directly under the first mesa structure
   the main diffraction grating is disposed at a region containing a node of a first higher-order transverse mode of the laser light,
   each of the sub-diffraction gratings is disposed at a region containing a node of a second higher-order transverse mode of the laser light,
   and
   each of the sub-diffraction gratings is disposed with its period and phase substantially equal to those of the main diffraction grating.

2. The device according to claim 1, further comprising a phase shifter provided at the center of the diffraction grating in the longitudinal direction of the first mesa structure.

3. The device according to claim 2, wherein
   a product κL of a coupling coefficient κ of the diffraction grating for a fundamental transverse mode and a resonator length L defined as a length of the diffraction grating in the longitudinal direction of the first mesa structure is set within a range from 1 to 1.5 inclusive.

4. The device according to claim 1, wherein
   a width of the main diffraction grating is set to 10% or less of that of a portion of the first mesa structure facing the silicon layer.

5. The device according to claim 1, wherein
   the silicon layer has a second mesa structure,
   the diffraction grating is formed on a surface of the second mesa structure, and
   a width of the main diffraction grating is set to 10% or less of that of the second mesa structure.

6. The device according to claim 1, wherein
   the width of each of the sub-diffraction gratings is set to smaller than that of the main diffraction grating and greater than half that of the main diffraction grating.

7. The device according to claim 1, wherein
   the main diffraction grating is disposed below a central point of the first mesa structure in a width direction thereof, and
   the sub-diffraction gratings are disposed below respective points at which the first mesa structure is divided into three equal parts in the width direction.

8. The device according to claim 1, wherein
   the silicon layer has a second mesa structure,
   the diffraction grating is formed on a surface of the second mesa structure,
   the main diffraction grating is disposed at a central point of the second mesa structure in a width direction thereof, and
   the sub-diffraction gratings are disposed at respective points at which the second mesa structure is divided into three equal parts in the width direction.

9. The device according to claim 1, wherein
   the compound semiconductor layer is in direct contact with the silicon layer.

10. The device according to claim 1, further comprising an insulating layer between the compound semiconductor layer and the silicon layer, the insulating layer having a thickness of 100 nm or less.

11. The device according to claim 1, further comprising a silicon dioxide layer in contact with an opposite surface of the silicon layer from the compound semiconductor layer.

12. The device according to claim 1, wherein
the device is a quantum cascade laser emitting light by a transition between subbands in a superlattice.

* * * * *